United States Patent
Nelson et al.

(10) Patent No.: US 9,301,432 B2
(45) Date of Patent: Mar. 29, 2016

(54) METHOD AND APPARATUS FOR COOLING ELECTRONIC EQUIPMENT

(75) Inventors: Dean H. Nelson, Union City, CA (US); Andreas V. Bechtolsheim, Palo Alto, CA (US); Michael C. Ryan, San Jose, CA (US)

(73) Assignee: Oracle America, Inc., Redwood Shores, CA (US)

( * ) Notice: Subject to any disclaimer, the term of this patent is extended or adjusted under 35 U.S.C. 154(b) by 1250 days.

(21) Appl. No.: 12/101,839

(22) Filed: Apr. 11, 2008

(65) Prior Publication Data

US 2008/0291626 A1 Nov. 27, 2008

Related U.S. Application Data

(60) Provisional application No. 60/931,624, filed on May 23, 2007.

(51) Int. Cl.
| | |
|---|---|
| *H05K 7/20* | (2006.01) |
| *F24F 1/00* | (2011.01) |
| *F24F 5/00* | (2006.01) |
| *F24F 11/00* | (2006.01) |

(52) U.S. Cl.
CPC .......... *H05K 7/20745* (2013.01); *F24F 1/0059* (2013.01); *F24F 5/0089* (2013.01); *F24F 5/0092* (2013.01); *F24F 11/0001* (2013.01); *H05K 7/2079* (2013.01); *F24F 2221/14* (2013.01)

(58) Field of Classification Search
CPC .............. H05K 7/20745; H05K 7/2079; F24F 11/0001; F24F 1/0059; F24F 5/0089; F24F 2221/14; F24F 5/0029
USPC .................. 62/259.2; 361/696, 699, 701, 695
See application file for complete search history.

(56) References Cited

U.S. PATENT DOCUMENTS

| | | | | |
|---|---|---|---|---|
| 5,094,676 | A * | 3/1992 | Karbacher | 96/142 |
| 6,034,873 | A * | 3/2000 | Stahl et al. | 361/701 |
| 6,131,647 | A * | 10/2000 | Suzuki et al. | 165/104.33 |
| 6,672,955 | B2 * | 1/2004 | Charron | 454/184 |
| 7,259,963 | B2 * | 8/2007 | Germagian et al. | 361/695 |
| 2004/0089011 | A1 * | 5/2004 | Patel et al. | 62/259.2 |
| 2005/0252027 | A1 * | 11/2005 | Kolari | 34/513 |
| 2006/0042287 | A1 * | 3/2006 | Nyheim et al. | 62/246 |
| 2006/0260338 | A1 * | 11/2006 | VanGilder et al. | 62/259.2 |

* cited by examiner

*Primary Examiner* — Allana Lewin Bidder
*Assistant Examiner* — Kun Kai Ma
(74) *Attorney, Agent, or Firm* — Osha Liang LLP

(57) ABSTRACT

A method for cooling electronic equipment. The method including propagating air through a first electronic component of the electronic equipment into a first enclosed area, where propagating the air through the first electronic component cools the first electronic component, circulating a refrigerant in a cooling loop, where the cooling loop comprises a heat exchanger, and propagating the air out of the first enclosed area by passing through the heat exchanger into a second enclosed area, where the air is cooled by passing through the heat exchanger.

20 Claims, 38 Drawing Sheets

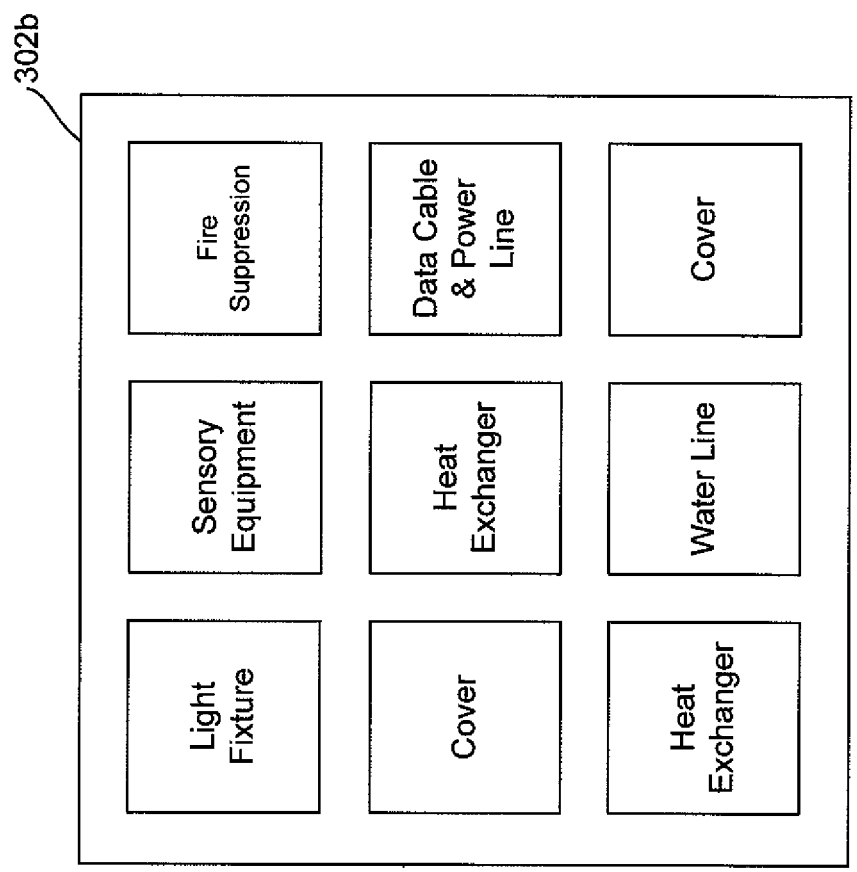

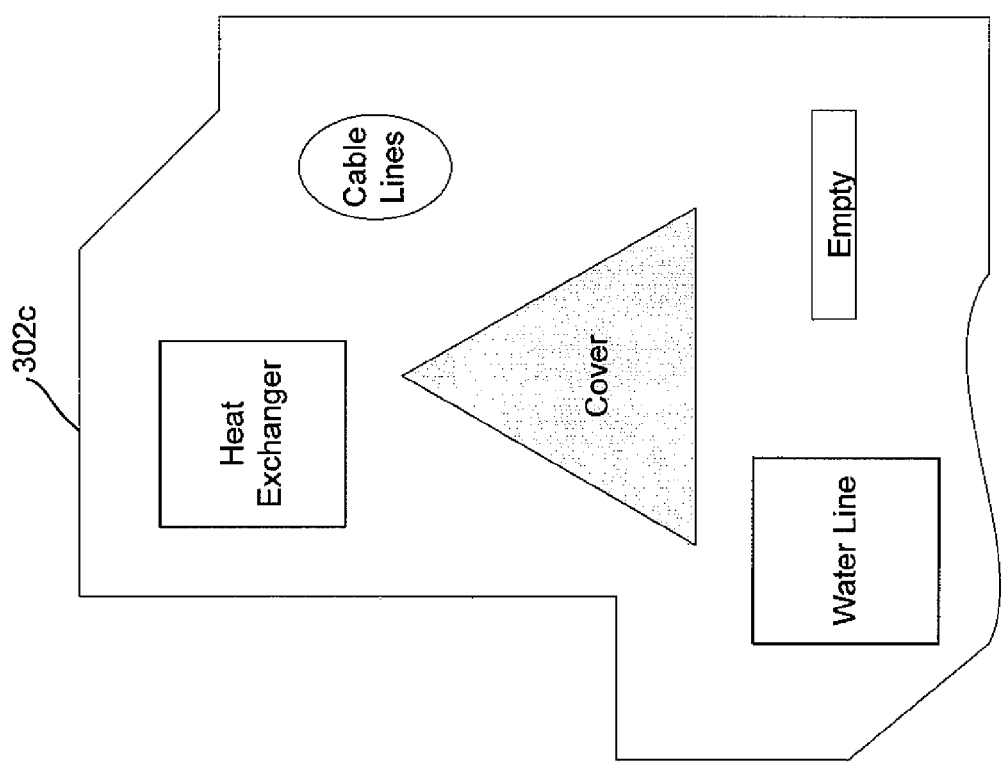

METHOD AND APPARATUS FOR COOLING ELECTRONIC EQUIPMENT

BACKGROUND

A computer system frequently needs data and/or services from another computer system. For example, a bank customer may request to see his current bank account information on his home computer system, which obtains the requested information from a computer system maintained by and located at the bank. In such arrangements, the computer system requesting the data and/or service is referred to and known as the "client" system, and the computer system servicing the request is referred to and known as the "server" system.

Many entities, for various reasons, situate groups of servers and related electronic equipment in "server rooms" or "data centers." Within a server room, several servers may be positioned vertically atop one another (with spacing) using a "rack." Racks of servers, memory units, power supplies, computers, etc. (hereinafter generally referred to as "electronic equipment") are often housed or enclosed in housings known as "cabinets" that provide protection from environmental variables such as, for example, light and dust. Cabinets may have front and back doors so as to allow for the servicing and changing of cabinet components. Moreover, cabinets reduce or prevent electromagnetic interference that might otherwise exist between, for example, different servers.

An important issue regarding server rooms and server operation involves temperature. As those skilled in the art will note, computer operation results in heat dissipation. In a server room, many electronic components are be operating at the same time, and thus, without adequate cooling, the components and related electronic equipment in the server room may be damaged or operate incorrectly as a result of high temperatures.

One cooling technique cools servers and related electronic equipment using air supplied from within the server room. FIG. 1 shows such a server room 110. The server room 110 has two cabinets 112, 114, each of which houses servers and/or related electronic equipment (not shown). Cold air is introduced into the server room 110 using a plenum 116 of cold air supplied by an air conditioning unit (not shown). The cold air from the plenum 116 is directed to the front of each cabinet 112, 114. Cold air entering the front of each cabinet 112, 114 flows through the cabinets 112, 114 and is heated by the heat dissipation of the electronic equipment housed in the cabinets 112, 114. Consequently, hot air exits from the rear of each cabinet 112, 114 and returns to the server room 110. The hot air rises and enters a cooling coil 118, which uses water or a refrigerant supplied by a chiller unit 120 to cool the hot air and return cold air back to the server room 110. This returned cold air is directed to the front of each cabinet 112, 114.

As servers and related electronic equipment become more powerful, heat dissipation increases. In other words, as servers and related electronic equipment continue to improve in terms of density, computing speed, and performance, more energy is released, thereby resulting in increased heat dissipation. Using only an air cooling technique to cool a server room having such increased heat dissipation requires the consideration of several issues. For example, air cooling such a server room might require an air plenum below the floor of the server room that is significantly wider than one used for a server room not having increased heat dissipation. Further, the mixing of cold air and hot air in the server room might be of more significant concern than in a server room not having increased heat dissipation. Further, the increased volume of air flow that would be required to cool the server room might render the server room uncomfortable for operators and technicians in the server room.

A technique that may be used to somewhat address the concerns associated with using only air cooling to cool high heat dissipation server rooms involves the use of a liquid coolant. Liquid cooling may be used in combination with a front-to-back air cooling technique, such as that described above with reference to FIG. 1. FIG. 2 shows such a technique. Particularly, FIG. 2 shows a side view of a cabinet 204. An air-liquid heat exchanger 202 is placed at the bottom of the cabinet 204 underneath electronic equipment (e.g., servers) 206. The hot air exiting from the rear of the electronic equipment is captured by a back door 208 of the cabinet 204 with fans (not shown) and is directed down along the back door 204 to the air-liquid heat exchanger 202. The air-liquid heat exchanger 202 cools the hot air, and the resulting cold air is directed up the front of the cabinet 204 between a front door 210 of the cabinet 204 and the electronic equipment 206 to be cooled. The air re-circulates within the cabinet 204 as the front door 210 and back door 208 of the cabinet 204 are closed. Those skilled in the art will note that the front and rear surfaces of the electronic equipment 206 represent space for connectors for the electronic equipment 206, and thus, front-to-back air cooling may limit such use of the front and rear surfaces of the electronic equipment 206.

Another technique used in conjunction with air cooling is cold plate cooling. Electronic equipment may be directly cooled using a cold plate. In other words, electronic equipment is cooled by contacting a cold plate device. Typical designs for cold plates include tubed cold plates and gun-drilled cold plates. In a tubed cold plate design, metallic tubes are embedded in a planar metal base. The tubes are usually formed from copper or stainless steel, while the cold plate is typically formed from copper or aluminum. In a gun-drilled cold plate design, holes are drilled directly into an aluminum or copper plate. These tubes or holes allow for the passage of a cooling fluid, which maintains the cold plate at a temperature useful for cooling electronic equipment attached to the cold plate. Cold plates may be configured to be compatible with many fluids and provide adequate bulk heat removal.

SUMMARY OF INVENTION

In general, in one aspect, one or more embodiments of the invention relate to a method for cooling electronic equipment, comprising: propagating air through a first electronic component of the electronic equipment into a first enclosed area, wherein propagating the air through the first electronic component cools the first electronic component, circulating a refrigerant in a cooling loop, wherein the cooling loop comprises a heat exchanger, and propagating the air out of the first enclosed area by passing through the heat exchanger into a second enclosed area, wherein the air is cooled by passing through the heat exchanger.

In general, in one aspect, one or more embodiments of the invention relate to an enclosure, comprising: a first electronic component of an electronic equipment cooled by air propagating through the first electronic component into a first enclosed area, a cooling loop arranged to circulate a refrigerant, wherein the cooling loop comprises a heat exchanger, and the heat exchanger arranged to receive air from the first enclosed area, wherein the air is cooled by passing through the heat exchanger into a second enclosed area.

In general, in one aspect, one or more embodiments of the invention relate to a modular cooling enclosure comprising: a plurality of walls and a roof that create a first enclosed area against electronic equipment, wherein the roof comprises a plurality of modular spaces, and wherein a cooling element is disposed in at least one of the plurality of modular spaces.

Other aspects and advantages of the invention will be apparent from the following description and the appended claims.

BRIEF DESCRIPTION OF DRAWINGS

FIG. 3B shows a barrier in accordance with one or more embodiments of the invention.

FIG. 3C shows a barrier in accordance with one or more embodiments of the invention.

DETAILED DESCRIPTION

Figure 1:
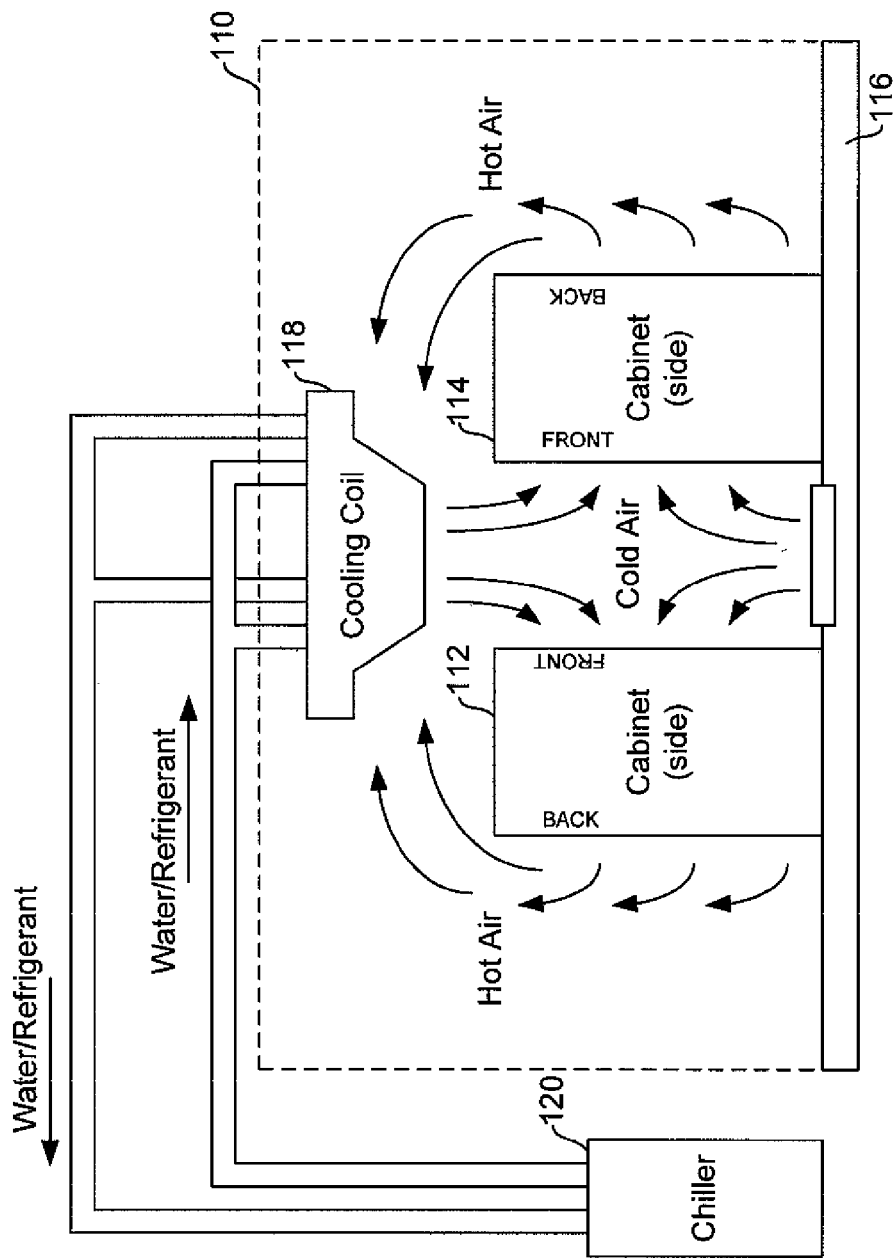
FIG. 1 shows a typical server room.
Figure 2:
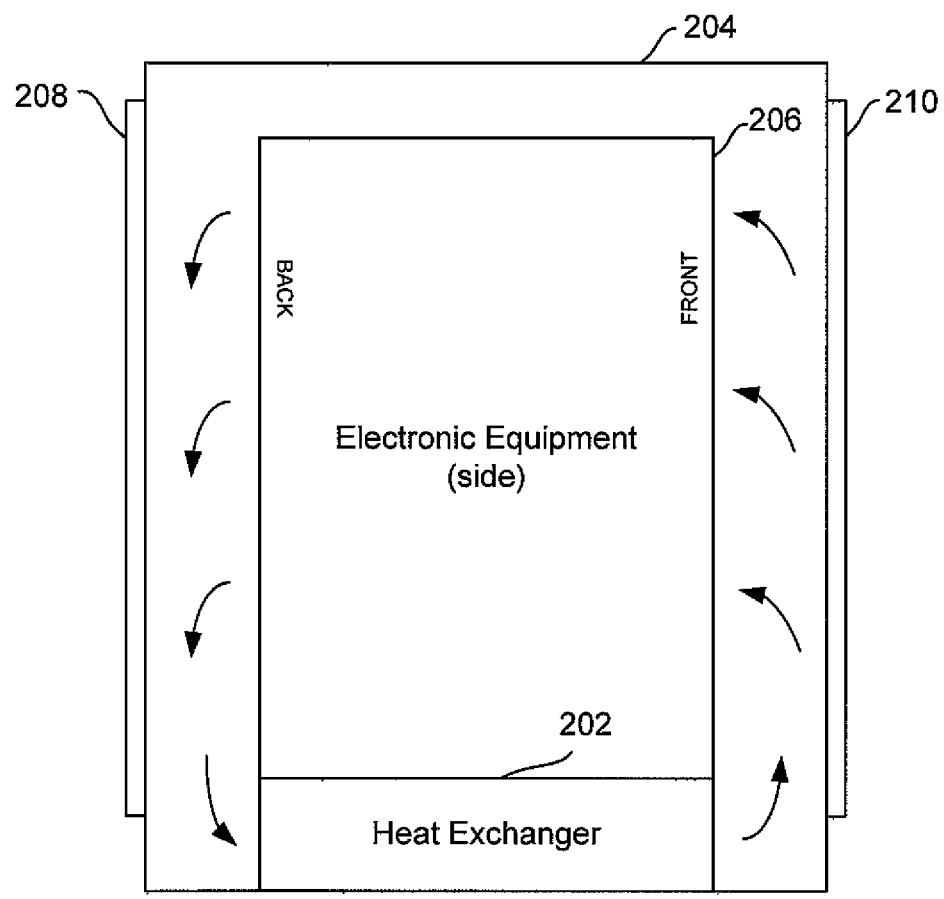
FIG. 2 shows a typical technique for cooling electronic equipment.

Specific embodiments of the invention will now be described in detail with reference to the accompanying figures. Like elements in the various figures are denoted by like reference numerals for consistency. Further, the use of "ST" in the figures is equivalent to the use of "Step" in the detailed description below.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Embodiments of the invention relate to methods and apparatus for cooling electronic equipment. More specifically, one or more embodiments of the invention relate to methods and apparatus for cooling electronic equipment using an enclosed area from which air may leave and/or enter through a heat exchanger.

Figure 3A:
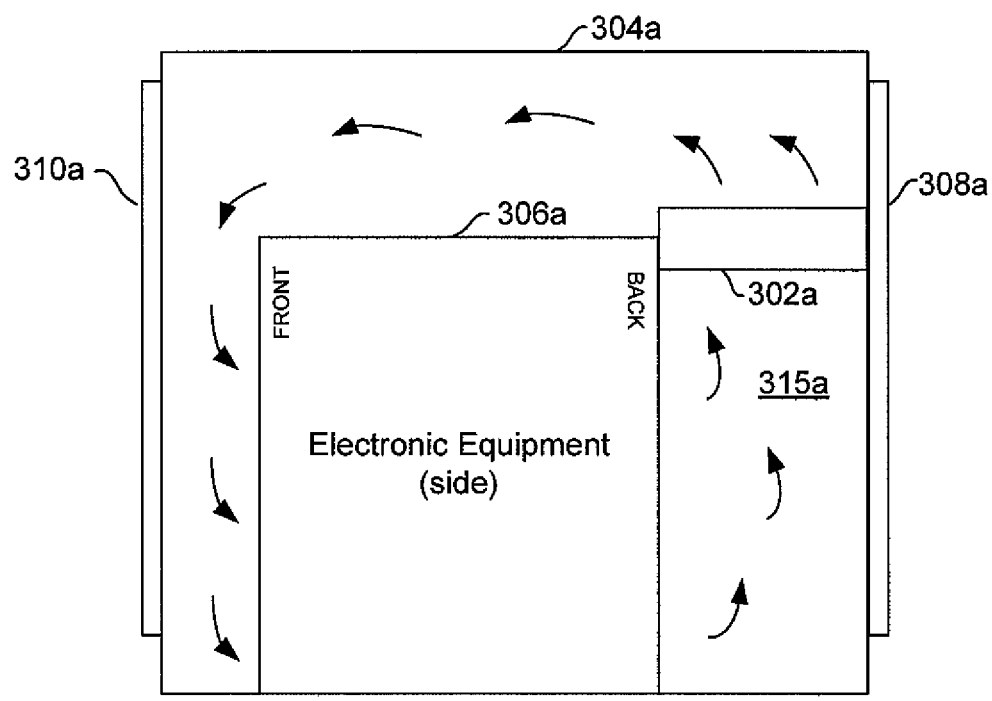
FIG. 3A shows a cooling system in accordance with one or more embodiments of the invention.

FIG. 3A shows an exemplary system in accordance with one or more embodiments of the invention. Specifically, FIG. 3A shows a cross-sectional front view of a portion of an enclosure 304a. The enclosure 304a corresponds to any containment structure (e.g., a room or a cabinet) that contains electronic equipment. As shown in FIG. 3A, the enclosure 304a includes a barrier 302a, at least one enclosed area (e.g. enclosed area 315a), and an electronic equipment 306a.

In one or more embodiments of the invention, the barrier 302b corresponds to a portion of the structure surrounding the enclosed area 315a that includes a heat exchanger (not shown). The barrier 302b may be of any shape, size, or material. The heat exchanger (not shown) corresponds to any device that includes functionality to cool air passing through the device. An example of a heat exchanger includes, but is not limited to, a structure with refrigerant lines into and out of the structure, flowing with gas and/or liquid refrigerants that includes functionality to cool air as the air passes over the cold refrigerant lines. This process results in (i) heating the entering refrigerant, where the resulting warm refrigerant is directed away from the heat exchanger through refrigerant lines and (ii) cooling air that passes through the heat exchanger. A refrigerant used in one or more embodiments of the invention may be a liquid or a gas with thermodynamic properties that cool electronic equipment. For example, a refrigerant may be air, alcohol, ammonia, water, carbon dioxide, or tetrafluoroethane (R-134a). Another example of a heat exchanger may include a structure with cold solids (e.g., dry ice, cold plates, etc.) which may cool the air passing over the cold solids.

Referring still to FIG. 3A, in one or more embodiments of the invention, the enclosed area 315a may correspond to any contained area within the enclosure 304a that allows the ingress of air into the contained area and/or egress of air out of the contained area through one or more heat exchangers in a barrier 302a. The air within the enclosure 304a and/or the enclosed area 315a may be pressurized in order to induce airflow. The enclosure 304a and/or the structure (including the barrier 302a) surrounding the enclosed area 315a may be made from different materials and/or components (e.g., construction materials, insulation materials, protective materials, removable pieces, interchangeable pieces, computer equipment, etc.).

The enclosure 304a and/or the enclosed area 315a may be tightly sealed or may contain small openings and/or entryways. Entryways may be sealed, for example with a front door 310a, a back door 308a, a sliding cover, a rotating doorway, a chimney entrance through the root a grid with modular spaces, a permanent cover, a detachable cover, a retractable cover, a brush kit, industrial plastic or any other suitable seal. In an enclosure 304a containing an aisle between multiple racks of electronic equipment or between a rack and some other enclosure-defining surface, e.g. a wall, an entryway (not shown) at the end of the aisle may provide direct access to the aisle (which may correspond to an enclosed area 315a). The enclosure 304a and/or the enclosed area 315a may also be enclosed with removable or detachable pieces. For example, the enclosure 304a and/or the enclosed area 315a may be enclosed with a shutter that can be retracted to access the enclosure 304a and/or the enclosed area 315a and closed to seal the enclosure 304a and/or the enclosed area 315a. In one or more embodiments of the invention, the openings and/or entryways of the enclosure 304a and/or the enclosed area 315a may be intended for heat exchangers, data lines, cable lines, power lines, refrigerant lines, emergency lines, and/or for any other input/output needed for the enclosure 304a and/or the enclosed area 315a.

In one or more embodiments of the invention, the openings and/or entryways into the enclosed area 315a may be in one or more modular barriers 302a. FIG. 3B shows an exemplary uniform modular barrier 302b associated with the enclosed area 315a. As shown in the exemplary embodiment, the barrier 302b includes a grid of nine spaces that may be designated for different components and/or lines (e.g., a power line, a cover, a heat exchanger, a light fixture, a data cable, a water line or other input/output). In an embodiment of the invention, each space in the grid may be 2 feet by 2 feet, however, the spaces within the grid may vary and may have any suitable shape. The designation for a space within the grid may be interchanged with another component and/or line. For example, if additional cooling is needed, a cover which simply prevents the flow of air may be replaced by a heat exchanger. Further, a space within the grid may contain multiple elements. For example, a space may contain a data cable and a power line or multiple heat exchangers, e.g., stacked or arranged side-by-side. In one or more embodiments of the invention, the exemplary modular barrier 302b may correspond to the roof or walls of the enclosed area 315a. Further, the exemplary modular barrier 302b may be trapezoidal, rectangular, curved, or any other appropriate shape.

FIG. 3C shows an exemplary non-uniform modular barrier 302c associated with the enclosed area 315a in accordance with one or more embodiments of the invention. Similar to the uniform modular barrier 302b, the non-uniform modular barrier 302c, may include spaces designed for interchangeable and/or multiple components.

Returning to FIG. 3A, in one or more embodiments of the invention, the enclosure 304a may include one or more air blowing devices (not shown). Air blowing devices may correspond to, for example, fans used to propagate air in enclosure 304a. The air blowing devices may be used to propagate air through the electronic equipment, into or out of the enclosed area within the enclosure, through a heat exchanger or circulate air anywhere else within the enclosure. Alternatively, in one or more embodiments of the invention, an air blowing device may not be needed as air may sufficiently be circulated by pressurization in an enclosed area or by rising due to heat through a heat exchanger or by the fans of the electronic components contained within the electronic equipment 306a.

Continuing with FIG. 3A, in one or more embodiments of the invention, the electronic equipment 306a is similar to the electronic equipment described above and comprises at least one electronic component. The electronic component in the electronic equipment 306a is cooled by air propagating through the electronic component and into the enclosed area 315a. The front end of the electronic component corresponds to any portion of the electronic equipment that intakes air for propagation through the electronic equipment. The back end of the electronic component corresponds to any portion of the electronic equipment that outputs air that has propagated through the electronic equipment into the enclosed area 315a. The enclosed area 315a, may be pressurized as a result of the air propagated into the enclosed area 315a, resulting in forcing the air through the heat exchanger in the barrier 302a. In an embodiment of the invention, the air may rise passively through the heat exchanger in the barrier 302a due to being heated from propagating through the electronic equipment 306a, and/or the air may be blown using an air blowing device through the heat exchanger in the barrier 302a out of the enclosed area. In one or more embodiments of the invention, the air may pass through the barrier 302a and enter a second area. The second area may or may not be an enclosed area. The air may be blown from the second enclosed area and/or the second enclosed area may be pressurized to propagate the air through the electronic equipment. In one or more embodiments of the invention, a pressurization technique may include actively controlling the level of pressure in or more sections in an enclosure to circulate the air through the enclosure 304a.

A server rack or other enclosure of an electronic equipment 306a may have multiple electronic components or groups of electronic components that need to be cooled. Similarly, multiple air blowing units, heat exchangers, and cold plate interfaces may be present in a given enclosure. Further, electronic components may be stacked serially, on top of other electronic components. While the devices in FIG. 3A are shown in a particular order, electronic components within the electronic equipment 306a may still be cooled when the devices are placed in a different order. In other words, multiple configurations are possible with respect to the placement of the devices in FIG. 3A.

Numerous variations may be made to embodiments of the invention. For example, temperature sensors may be used in electronic equipment 306a or return lines to determine whether electronic equipment 306a is being adequately cooled. If a determination is made that electronic equipment 306a is not being adequately cooled, the flow rate of refrigerants or coolants may be increased. Similarly, fans may increase the speed of air flowing through an enclosure based on the temperature sensors. Alternatively, warning indicators may be set off in response to the temperature sensors alerting an administrator that cooling is insufficient.

Figure 4:
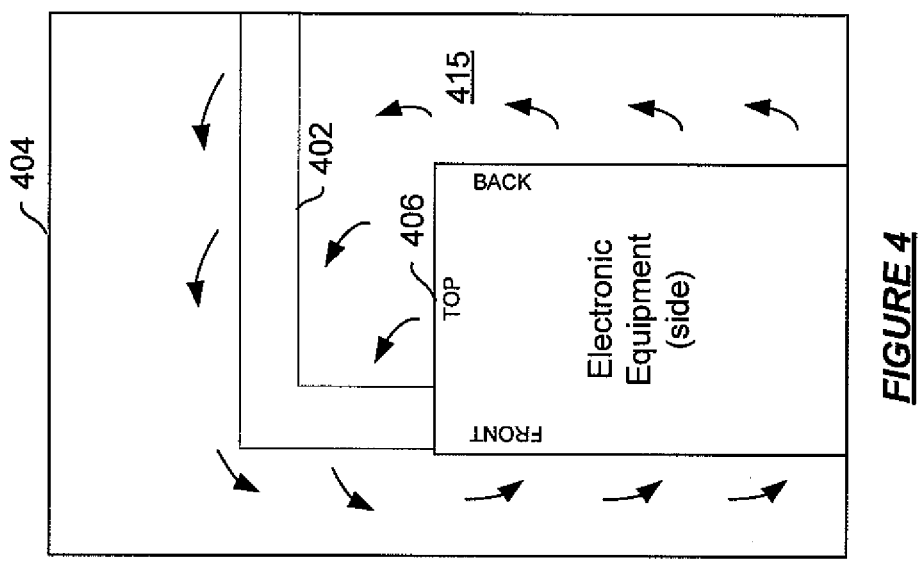
FIGS. 4-19 show a cooling system in accordance with one or more embodiments of the invention.

FIGS. 4 through 19 show other exemplary configurations of systems in accordance with one or more embodiments of the invention. Similar to FIG. 3, FIG. 4 shows a cross-sectional front view of a portion of an enclosure 404. The electronic component in the electronic equipment 406 is cooled by air propagating through the electronic component and into the enclosed area 415. In this example, air is propagated into the electronic component from the front end and propagated out of the back end of the electronic equipment and the top of the electronic equipment into the enclosed area 415. The barrier 402 extends from the wall to the electronic equipment 406 in a rectangular shape to enclose the enclosed area 415. One or more heat exchangers may be located in any part of the barrier 402 (e.g., the top horizontal portion and/or the side vertical portion) in addition to cable lines, power lines, lights, or any other components.

Figure 5:
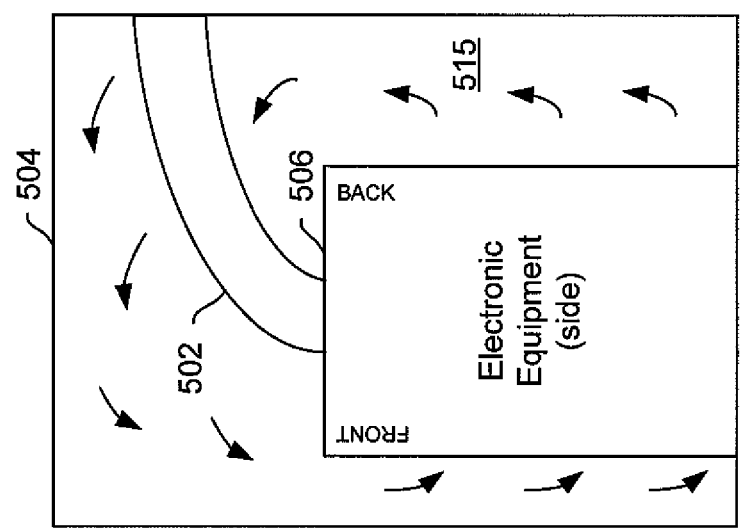

FIG. 5 is similar to FIG. 4 providing an example of a curved barrier 502 extending from the wall to the electronic equipment 506 to enclose the enclosed area 515. One or more heat exchangers may be mounted anywhere on the curved barrier 502.

Figure 6:
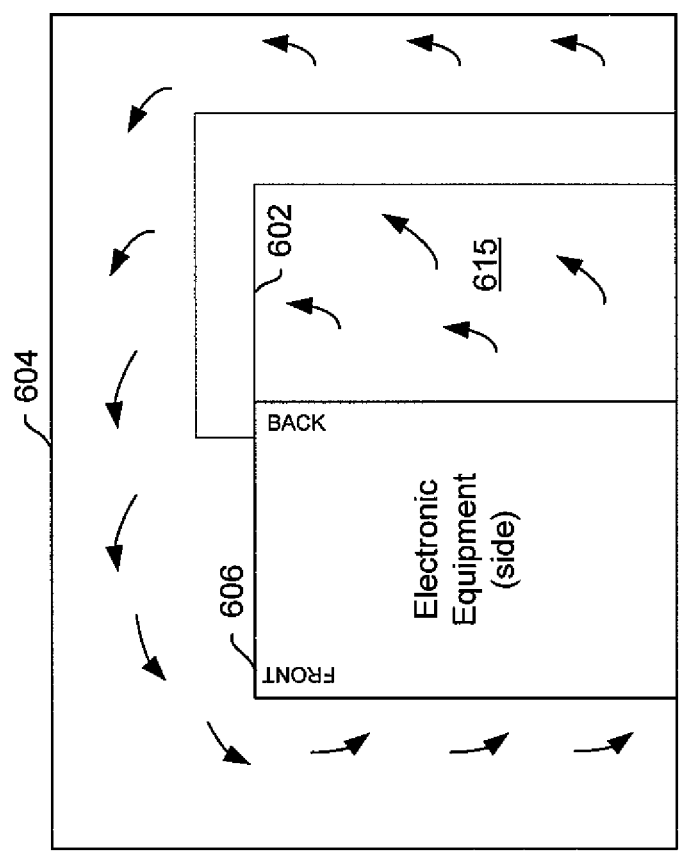

FIG. 6 is similar to FIG. 4 providing an example of a rectangular barrier 602 extending from the floor to the electronic equipment 606 to enclose the enclosed area 615. One or more heat exchangers may be mounted anywhere on the rectangular barrier 602.

Figure 7:
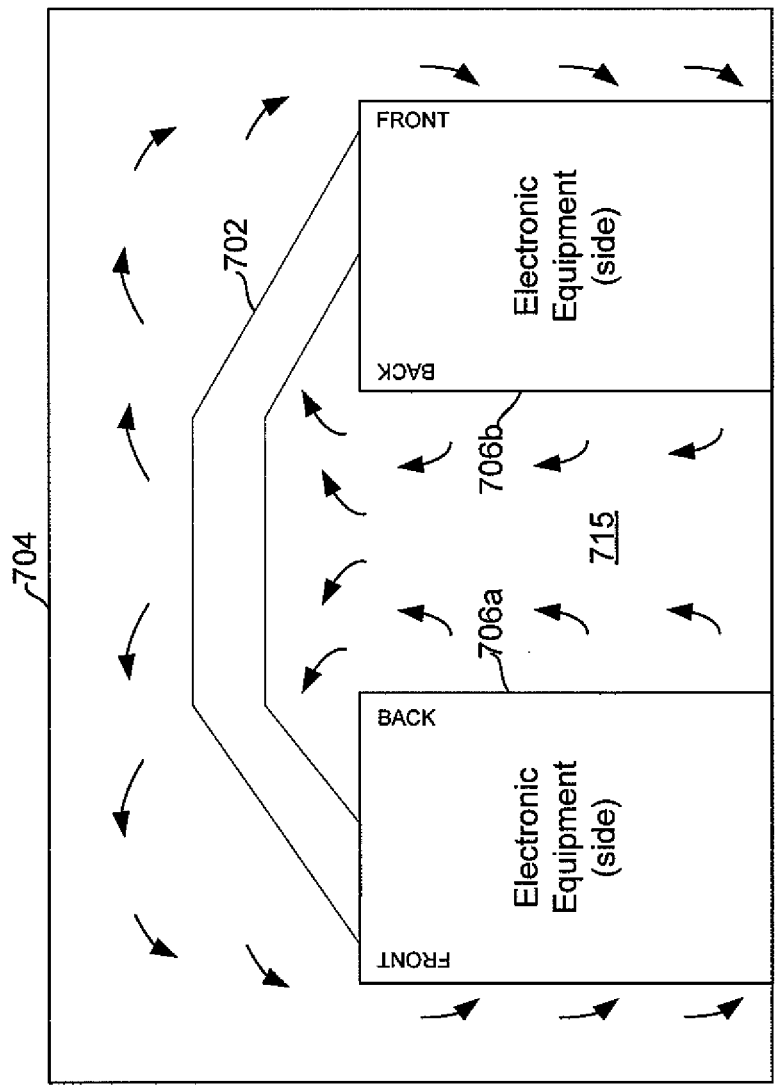

FIG. 7 shows an exemplary system in accordance with one or more embodiments of the invention. Specifically, FIG. 7 shows a cross-sectional front view of a portion of an enclosure 704. The enclosure 704 corresponds to any containment structure (e.g., a room or a cabinet) that contains multiple electronic equipment. As shown in FIG. 7, the enclosure 704 includes at least one barrier 702, and at least one enclosed area (e.g. enclosed area 715), an electronic equipment 706a and an electronic equipment 706b. The electronic equipment 706a and the electronic equipment 706b are cooled by air propagating through the electronic equipment 706a and the electronic equipment 706b and into the same enclosed area 715. The enclosed area 715, may be pressurized as a result of the air propagated into the enclosed area 715, resulting in forcing the air through the heat exchanger in the barrier 702. In an embodiment of the invention, the air may rise passively through the heat exchanger in the barrier 702 due to being heated from propagating through the electronic equipment 706a and electronic equipment 706b. In an embodiment of the invention, the air may be blown using an air blowing device through the heat exchanger in the barrier 702 out of the enclosed area. In one or more embodiments of the invention, the air may pass through the barrier 702 and enter a second area. The second area may or may not be an enclosed area.

The air may be blown from the second enclosed area, sucked form the second enclosed area and/or the second enclosed area may be pressurized to propagate the air through the electronic equipment 706a and the electronic equipment 706b.

Figure 8:
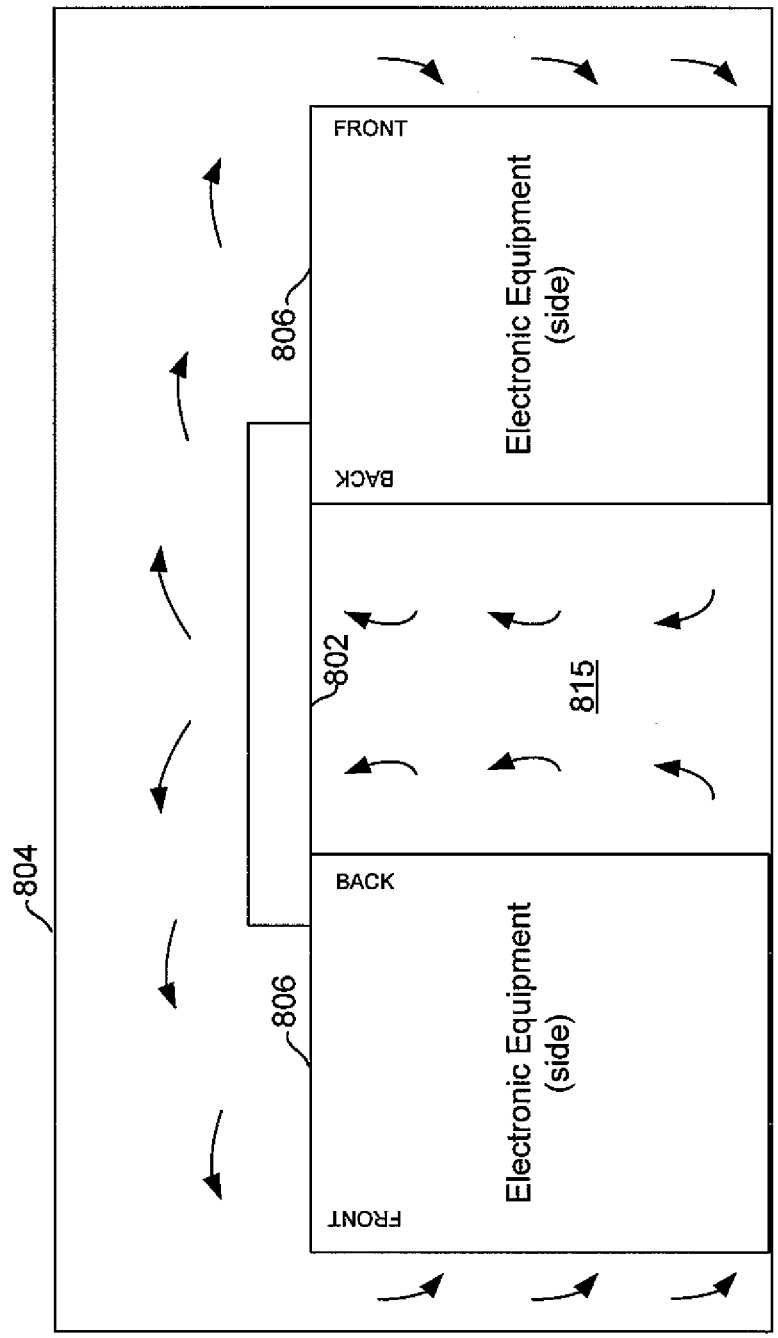
Figure 9:
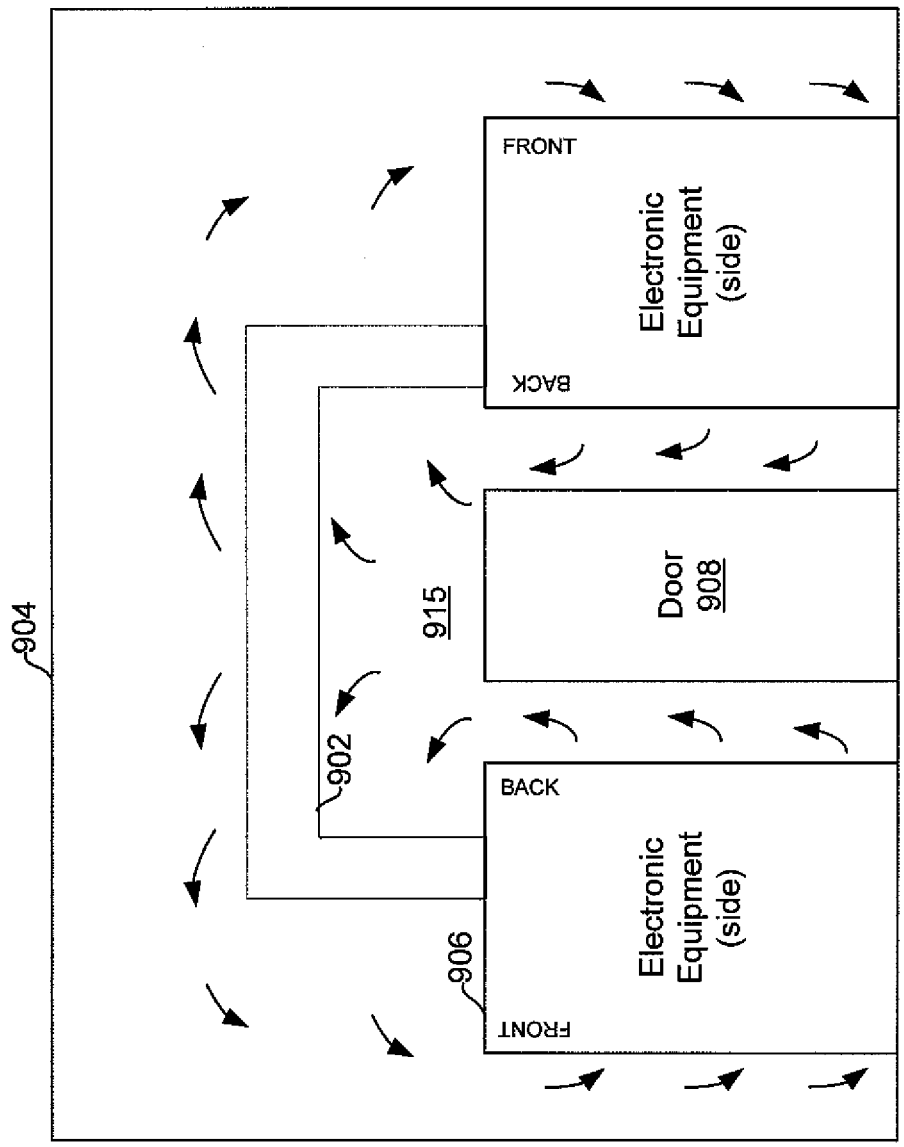

FIGS. 8 and 9 are similar to FIG. 7, providing examples of a straight barrier 802 extending from electronic equipment 806a to electronic equipment 806b and a rectangular barrier 902 extending from electronic equipment 906a to electronic equipment 906b. Further, FIG. 9 includes an exemplary door 908 to the enclosed area 915 in accordance with one or more embodiments of the invention.

Figure 10:
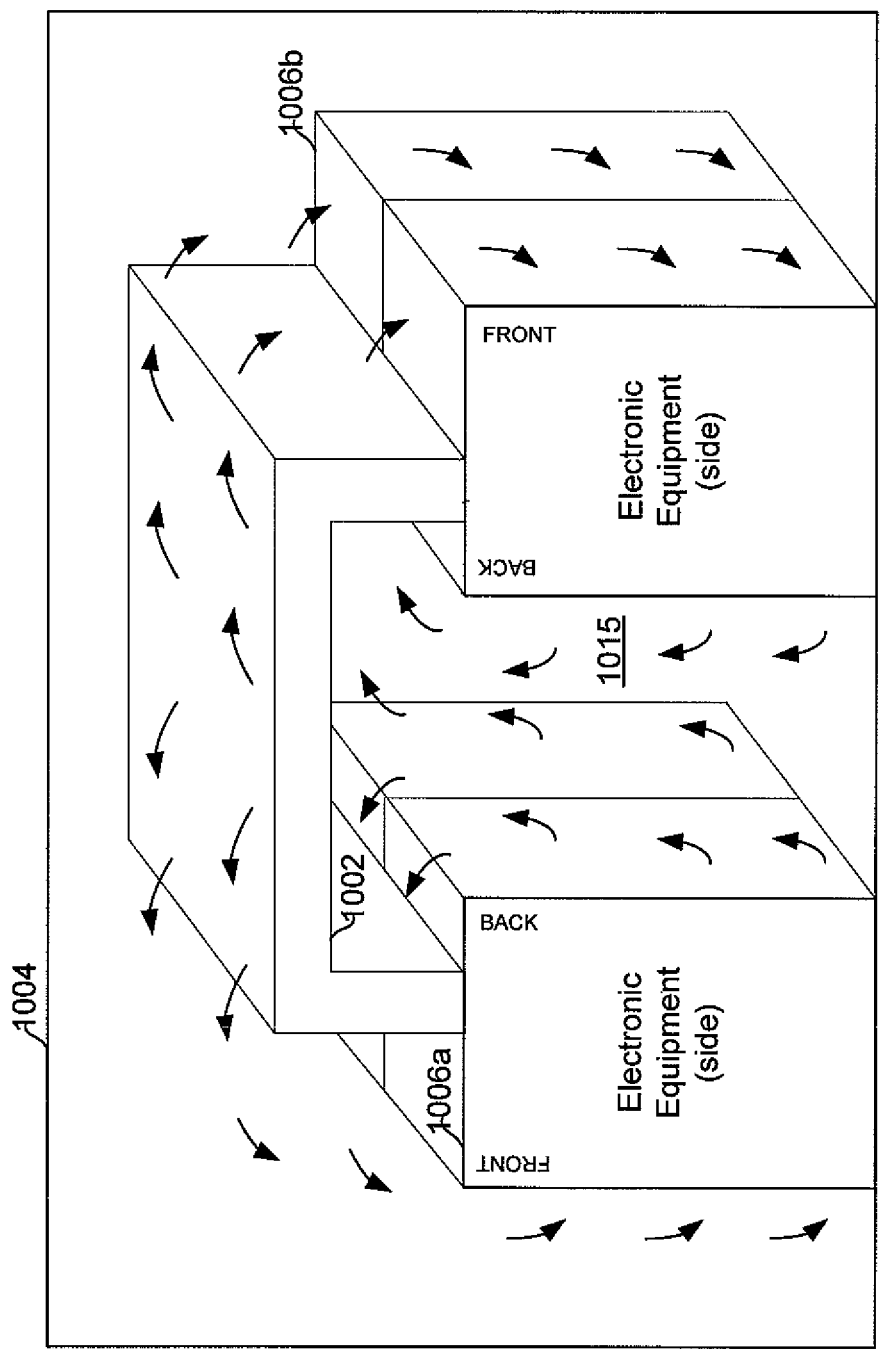

FIG. 10 shows an exemplary system in accordance with one or more embodiments of the invention. Specifically, FIG. 10, which is similar to FIG. 9, shows a perspective view of a portion of an enclosure 1004. The exemplary embodiment includes two racks of servers 1006a and 1006b with an enclosed area 1015 configured to receive air propagated through the racks of servers 1006a and 1006b.

Figure 11:
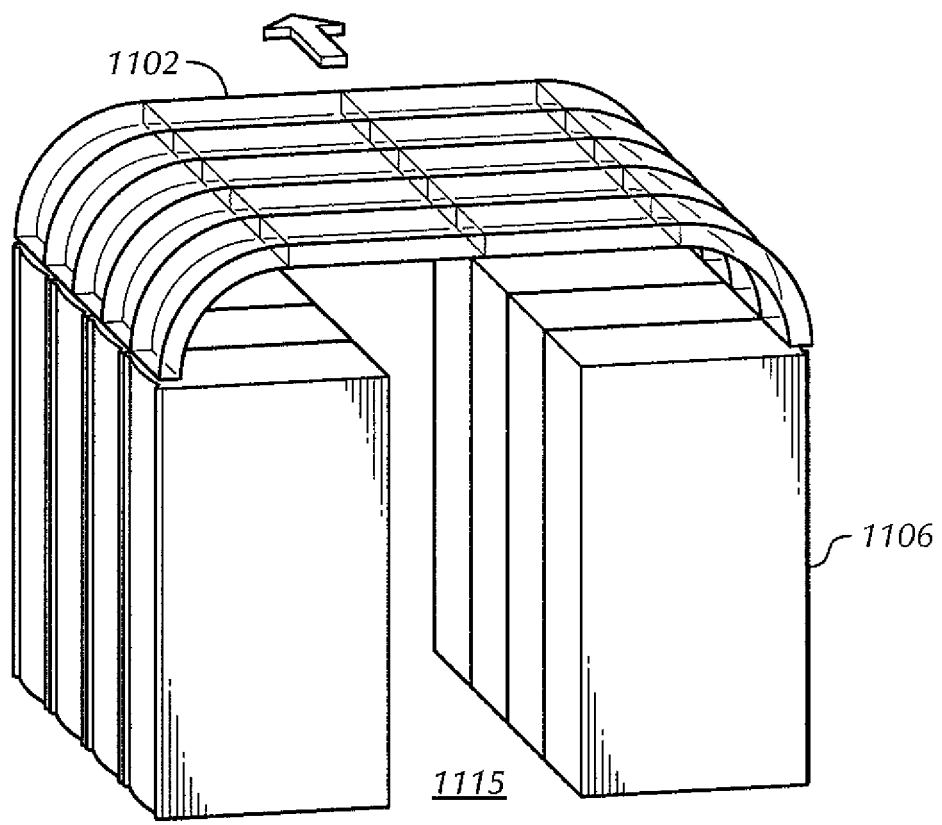
Figure 12:
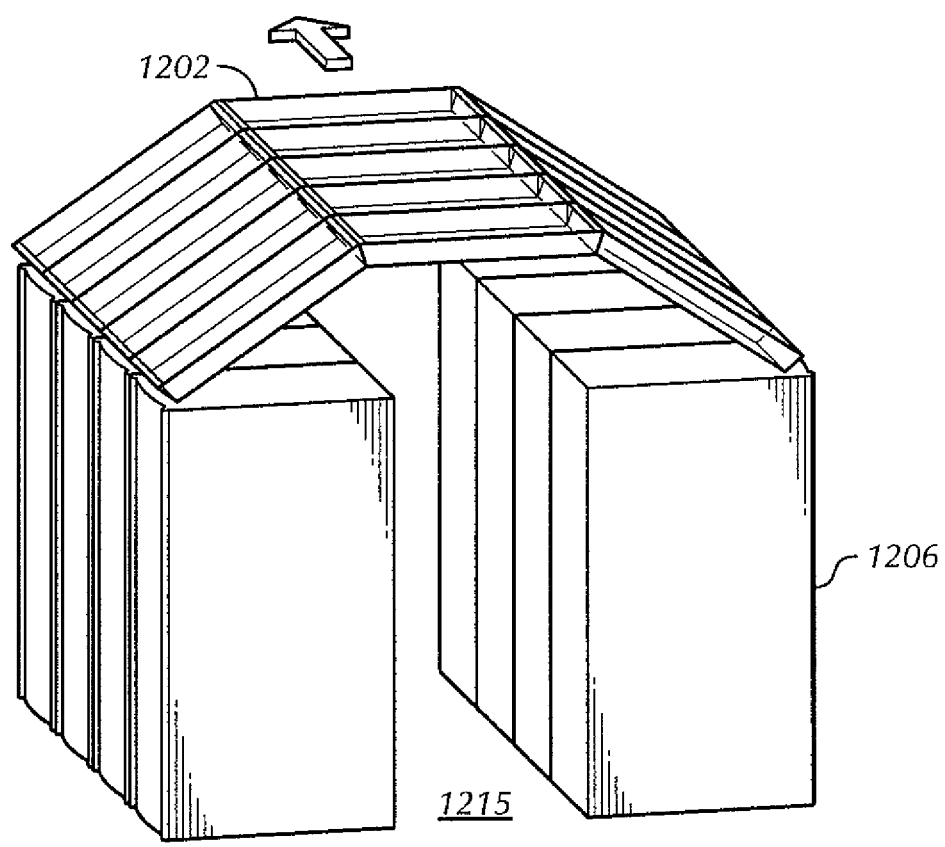
Figure 13:
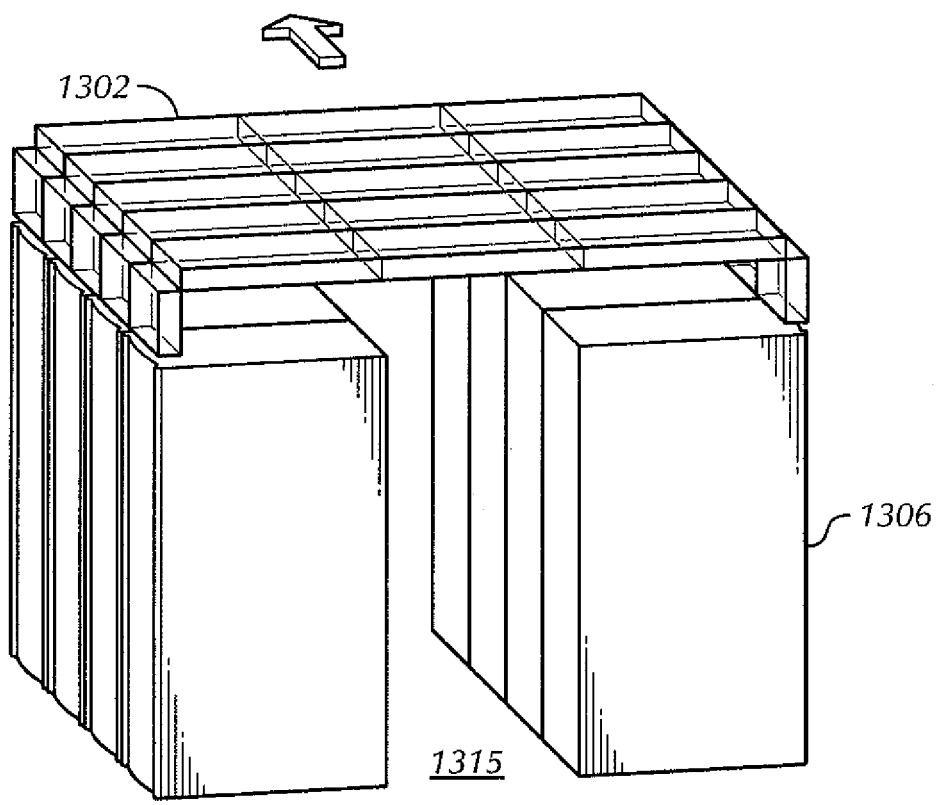

FIGS. 11-13 show exemplary systems in accordance with one or more embodiments of the invention. FIG. 11 shows a perspective view of a system in accordance with one or more embodiments of the invention. FIGS. 12-13 show a perspective view of one or more embodiments of the invention where the roof of the enclosure is trapezoidal and arcuate, respectively.

Figure 14:
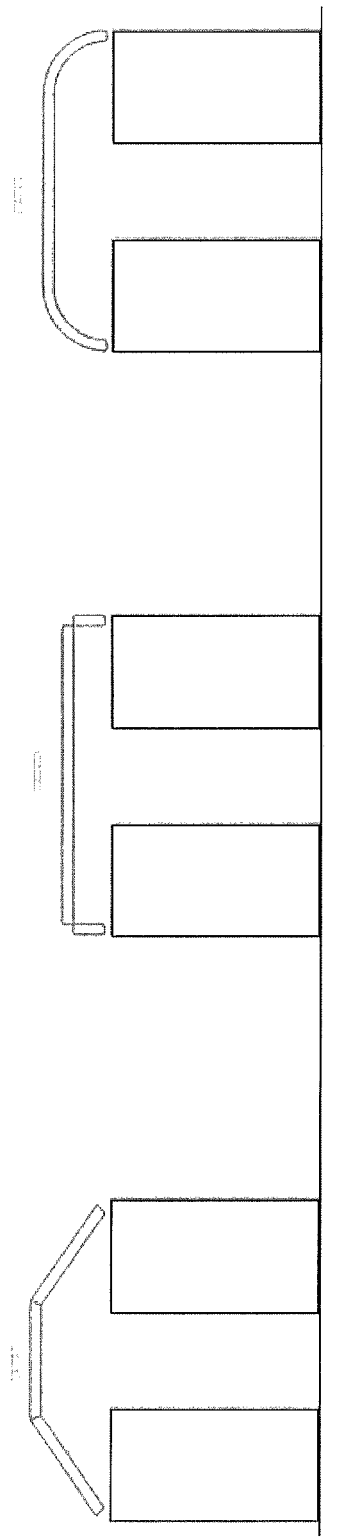

FIG. 14 shows a cross-sectional view of the embodiments shown in FIGS. 11-13. As can be seen in FIGS. 11-13, any number of pieces of electronic equipment may be enclosed by embodiments of the present invention, e.g., four racks are shown on each side of the enclosed aisle.

Figure 15:
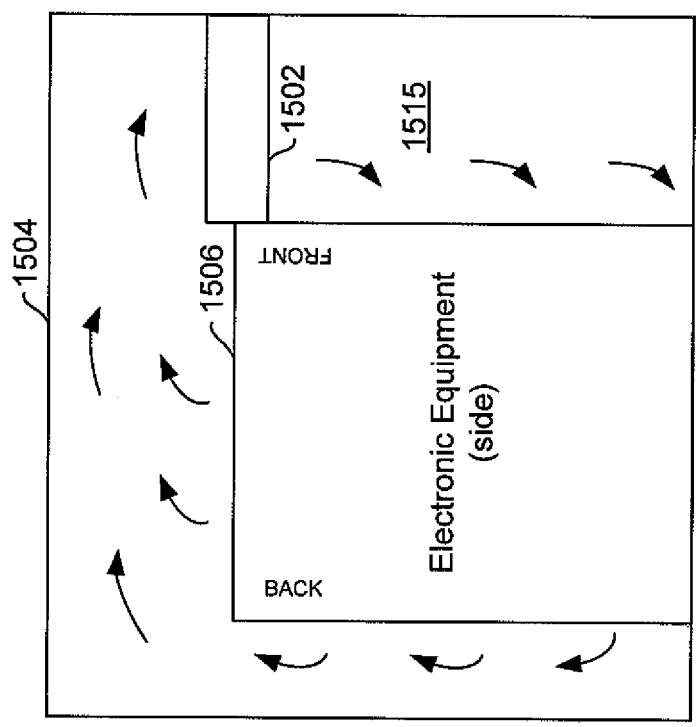

FIG. 15 shows an exemplary system in accordance with one or more embodiments of the invention. Specifically, FIG. 15 shows a cross-sectional front view of a portion of an enclosure 1504. The enclosure 1504 corresponds to any containment structure (e.g., a room or a cabinet) that contains multiple electronic equipment. As shown in FIG. 7, the enclosure 1504 includes at least one barrier 1502, and at least one enclosed area (e.g. enclosed area 1515), and electronic equipment 1506. The barrier 1502 includes at least one heat exchanger used to cool air flowing into the enclosed area 1515. The air may be blown into the enclosed area 1515 through the heat exchanger in the barrier 1502, sucked through the heat exchanger in the barrier 1502, or may passively flow through the heat exchanger in the barrier 1502. The enclosed area 1515 is configured to contain air cooled by the heat exchanger. The electronic equipment 1506 is cooled by air from the enclosed area 1515 propagated through the electronic component. The enclosed area 1515, may be pressurized as a result of the air propagated into the enclosed area 1515, resulting in forcing the air through the electronic equipment or the air may be blown into and/or sucked into the electronic equipment with the use of air blowing devices.

Figure 16:
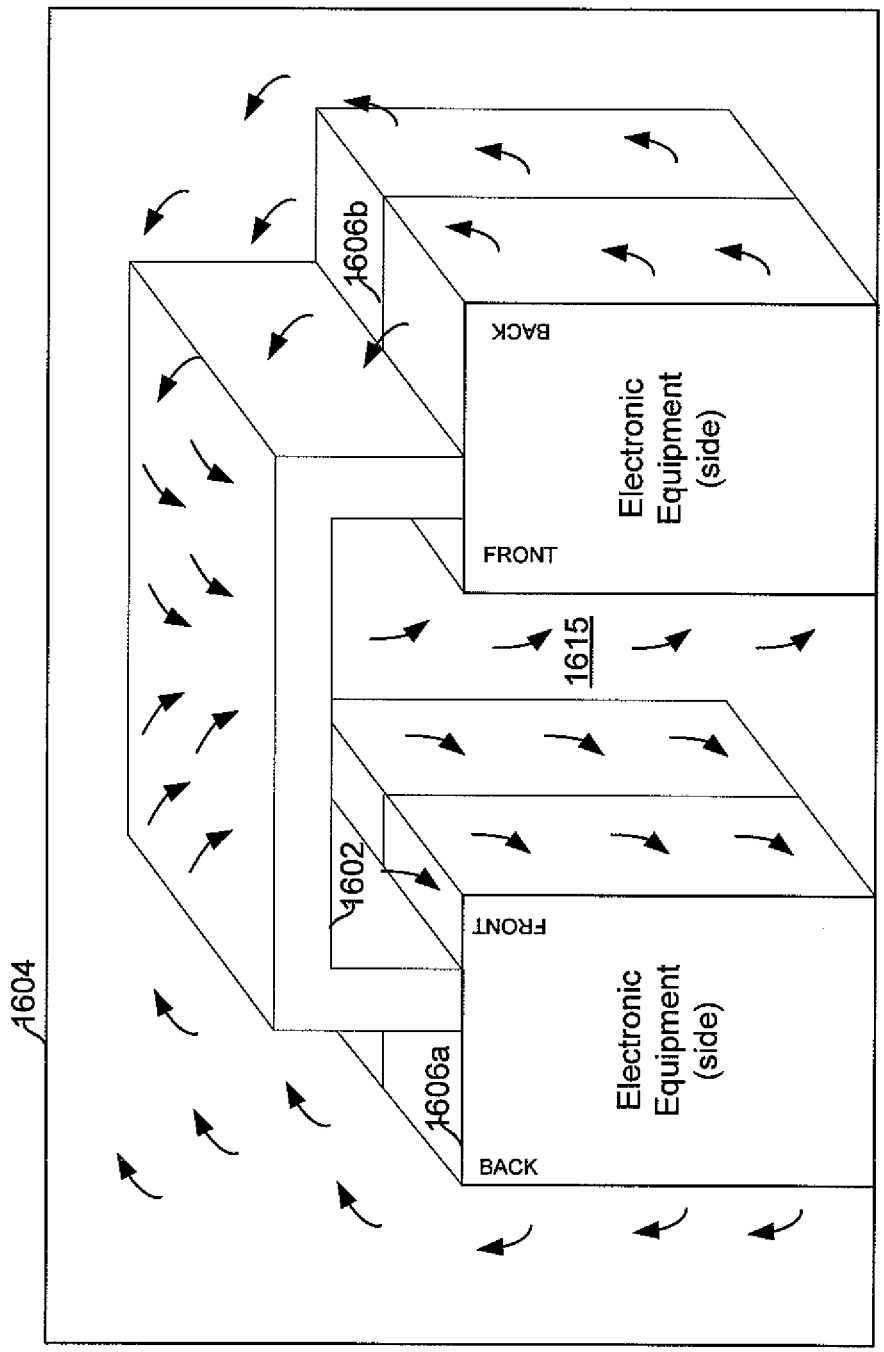

FIG. 16 is similar to FIG. 15 providing an example of a rectangular barrier 1602 extending from the electronic equipment 1606a to electronic component 1606b. FIG. 16 is perspective view of a system in accordance with one or more embodiments of the invention.

Figure 17:
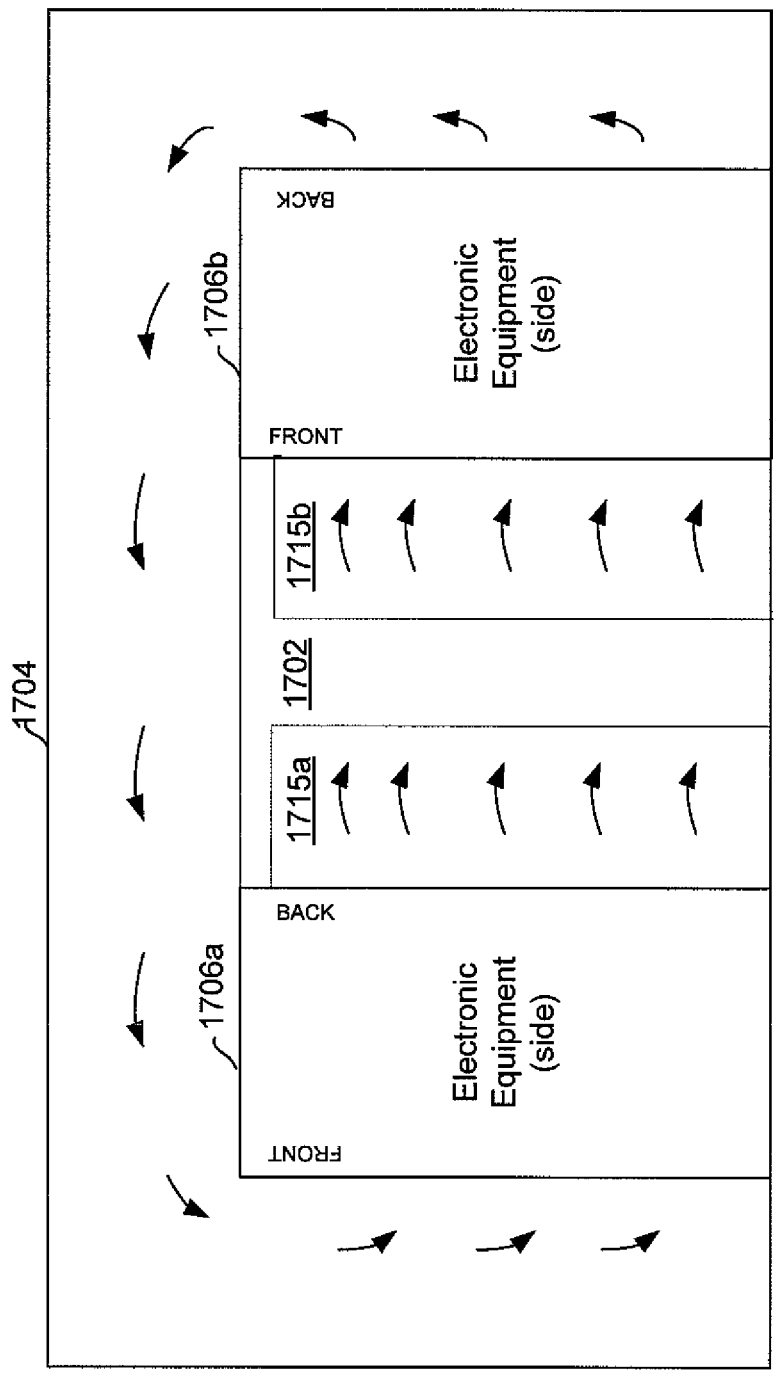

FIG. 17 shows an exemplary system in accordance with one or more embodiments of the invention. Specifically, FIG. 17 shows a cross-sectional front view of a portion of an enclosure 1704. The enclosure 1704 corresponds to any containment structure (e.g., a room or a cabinet) that contains multiple electronic equipment. As shown in FIG. 17, the enclosure 1704 includes at least one barrier 1702, at least two enclosed areas (i.e. enclosed area 1715a and 1715b), electronic equipment 1706a and electronic equipment 1706b. The electronic equipment 1706a is cooled by air propagating through the electronic component 1706a and into enclosed area 1715a. Subsequently, the air from 1715a is propagated through a heat exchanger in the barrier 1702, into the enclosed area 1715b. The air from the enclosed area 1715b is propagated through electronic equipment 1706b to cool at least one electronic component in the electronic equipment 1706b. In one or more embodiments of the invention, the electronic equipment 1706a, electronic equipment 1706b, the barrier 1702, may be configured differently (e.g., stacked vertically), where air propagated from the electronic equipment 1706a is cooled by passing from a first enclosed area to a second enclosed area and subsequently used to cool the electronic equipment 1706b.

Figure 18:
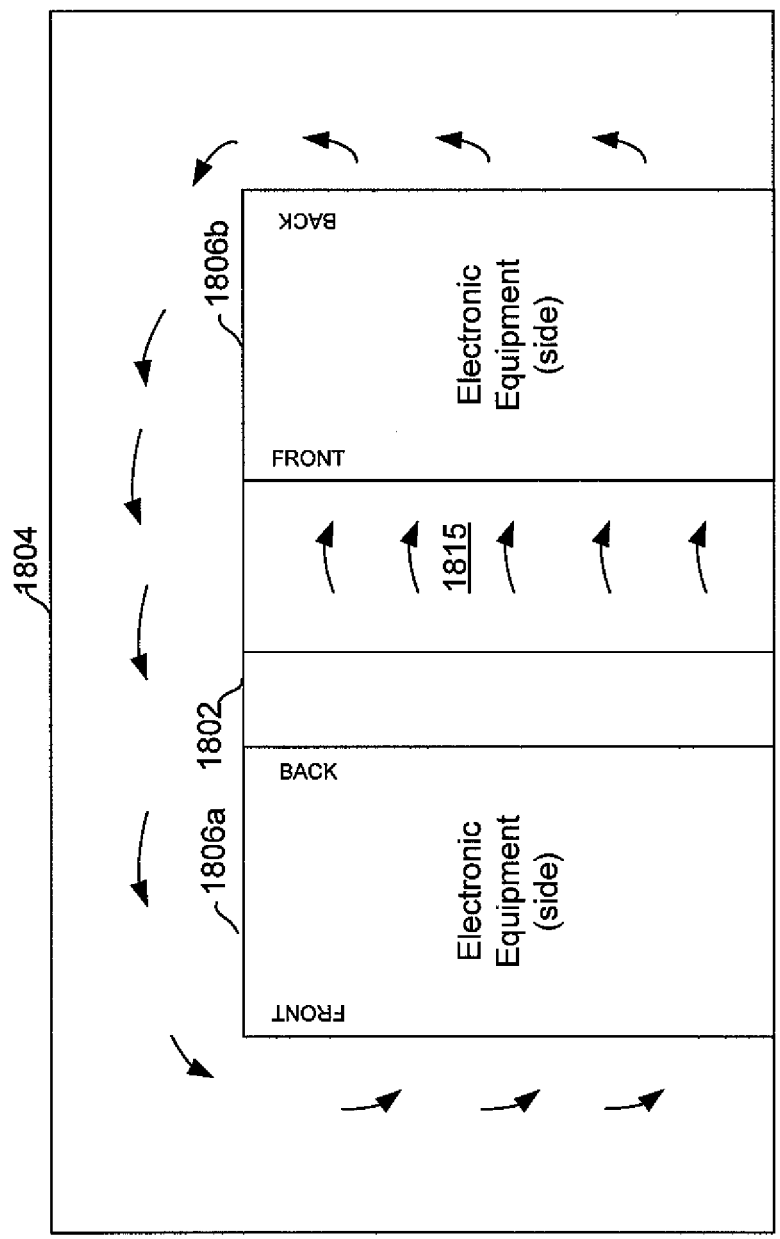

FIG. 18 shows an exemplary system in accordance with one or more embodiments of the invention. Specifically, FIG. 18 shows a cross-sectional front view of a portion of an enclosure 1804. The enclosure 1804 corresponds to any containment structure (e.g., a room or a cabinet) that contains multiple electronic equipment. As shown in FIG. 18, the enclosure 1804 includes a barrier 1802, at least one enclosed area (e.g. enclosed area 1815), an electronic equipment 1806a and an electronic equipment 1806b. In one or more embodiments of the invention, the air is propagated through electronic equipment 1806a and subsequently through a heat exchanger in the barrier 1802 and into the enclosed area 1815. The air is heated when propagated through the electronic equipment 1806a and subsequently cooled when propagated through the heat exchanger in the barrier 1802. The cooled air in the enclosed area 1815 is then propagated through the electronic equipment 1806b to cool an electronic component of the electronic equipment 1806b.

Figure 19:
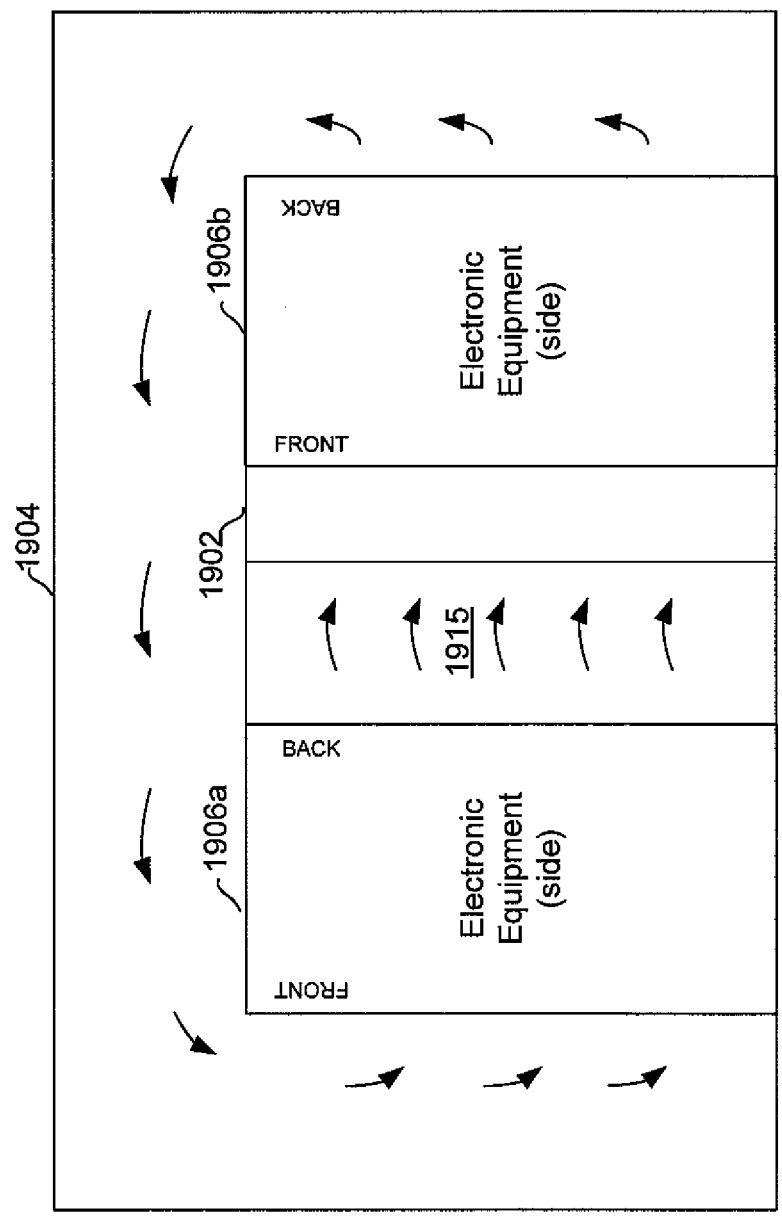

FIG. 19 shows an exemplary system in accordance with one or more embodiments of the invention. Specifically, FIG. 19 shows a cross-sectional front view of a portion of an enclosure 1904. The enclosure 1904 corresponds to any containment structure (e.g., a room or a cabinet) that contains multiple electronic equipment. As shown in FIG. 18, the enclosure 1904 includes a barrier 1902, at least one enclosed area (e.g. enclosed area 1915), an electronic equipment 1906a and an electronic equipment 1906b. In one or more embodiments of the invention, the air is propagated through electronic equipment 1906a into the enclosed area 1915. The air from the enclosed area 1915 is subsequently propagated through a heat exchanger in the barrier 1902 and thereafter directly propagated through the electronic equipment 1906b to cool an electronic component of the electronic equipment 1906b.

Figure 20:
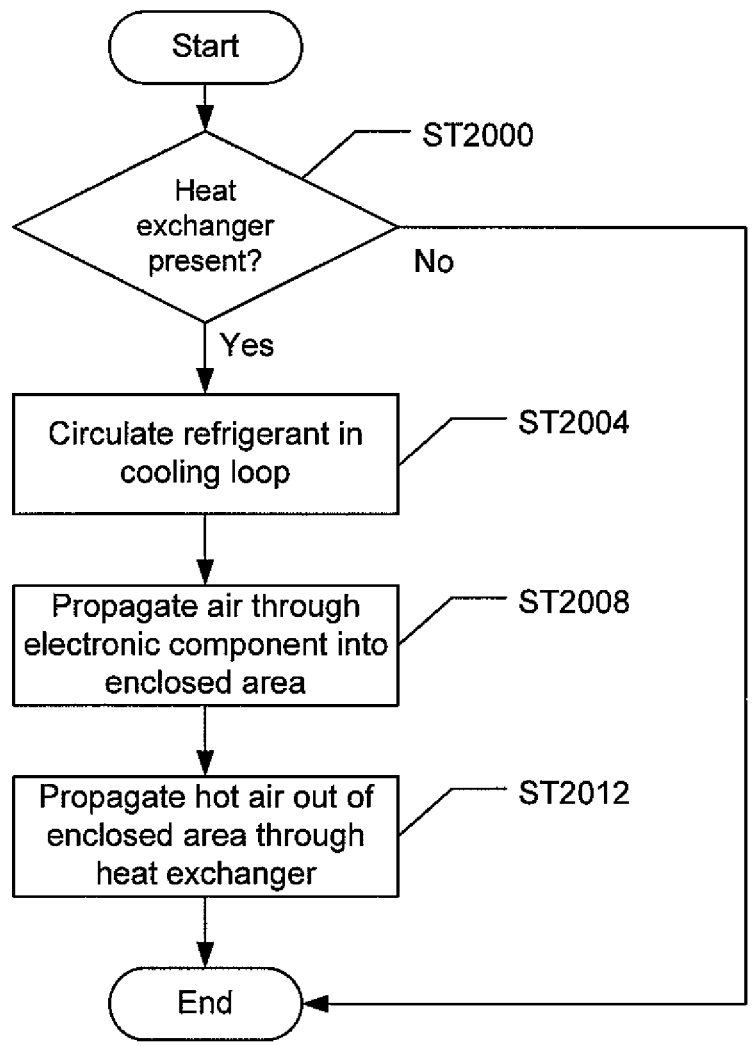
FIGS. 20-21 show a flowchart for a cooling system in accordance with one or more embodiments of the invention.

FIG. 20 shows a flowchart for cooling electronic equipment in accordance with one or more embodiments of the invention. In one or more embodiments of the invention, one or more of the steps described below may be omitted, repeated, and/or performed in a different order. Accordingly, the specific arrangement of steps shown in FIG. 20 is merely an example.

Initially, a determination is made as to whether a heat exchanger in accordance with one or more embodiments of the invention is present (Step 2000). If a heat exchanger is present, then refrigerant is circulated in a cooling loop of the heat exchanger in an enclosure including the electronic equipment (Step 2004).

Next, air is propagated through an electronic component of the electronic equipment into an enclosed area in accordance with one or more embodiments of the invention (Step 2008). The air may be propagated through the electronic component in any manner including, but not limited to, blowing air into the electronic equipment and sucking air into the electronic equipment. The air may be propagated through the electronic component in short periodic bursts or with a continuous flow of air. Propagating the air through the electronic component results in cooling of the electronic component and heating of the air propagated through the electronic component. In one or more embodiments of the invention, the air leaving the electronic component is hot or warmer than before propagating through the electronic component. In one or more embodiments of the invention, a substantial portion of the air leaving the electronic component enters an enclosed area.

The air in the enclosed area propagates out of the enclosed area through a heat exchanger in a structure enclosing the enclosed area (Step 2012). The air may be blown out of the enclosed area, sucked out of the enclosed area, pressurized out of the enclosed area, or passively flow out of the enclosed area (e.g., hot air rising up and through a heat exchanger above the enclosed area). The air may propagate out of the enclosed area in a continuous manner or in short periodic bursts. For example, the heat exchanger may continuously allow the flow of air out of the enclosed area. Alternatively, the heat exchanger may prevent air from escaping the enclosed area, and allow passage of air when air pressure is built up within the enclosed area. In one or more embodiments of the invention, air is cooled as it propagates through the heat exchanger. The air may be cooled in any manner including, but not limited to, using gas, liquid and solid refrigerants within the heat exchanger. In one or more embodiments of the invention, air propagated out of the enclosed area through the heat exchanger is propagated into another enclosed area from which the air is re-circulated through the electronic equipment.

In one or more embodiments of the invention, the heat exchanger may be reversed to cool and propagate the cool air into the enclosed area. In addition, electronic equipment may be reconfigured to propagate air from the enclosed area through the electronic component to cool the electronic component.

Figure 21:
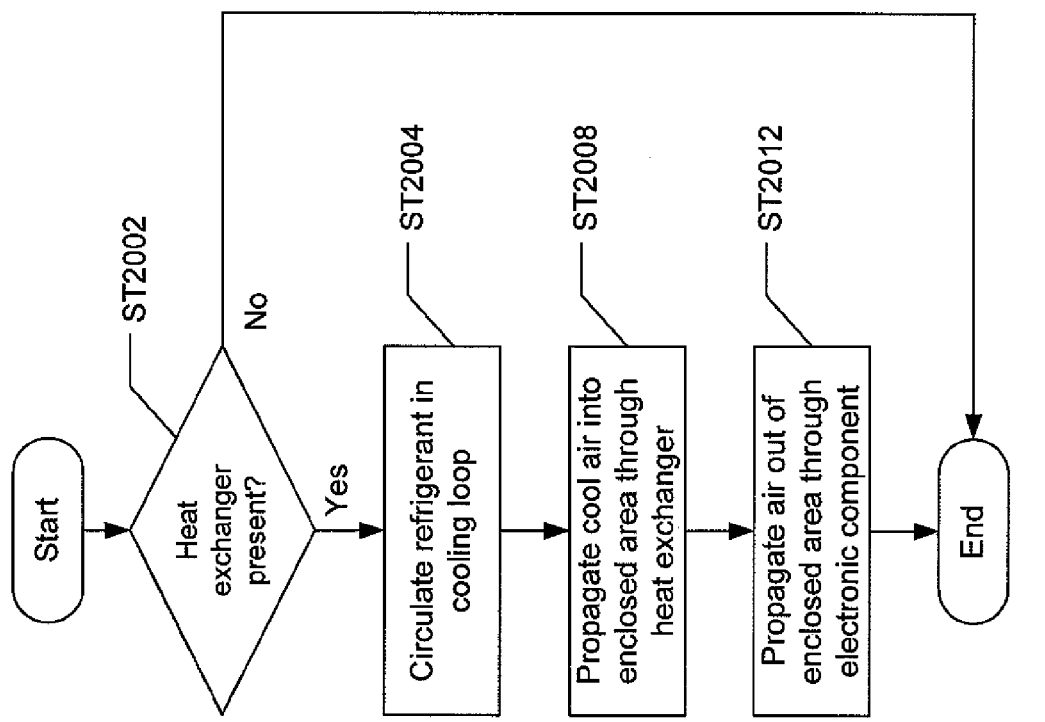

FIG. 21 shows a flowchart for cooling electronic equipment in accordance with one or more embodiments of the invention. In one or more embodiments of the invention, one or more of the steps described below may be omitted, repeated, and/or performed in a different order. Accordingly, the specific arrangement of steps shown in FIG. 21 is simply an example.

Initially, a determination is made as to whether a heat exchanger in accordance with one or more embodiments of the invention is present (Step 2100). If a heat exchanger is present, then refrigerant is circulated in a cooling loop of the heat exchanger in an enclosure including the electronic equipment (Step 2104).

Next, air is propagated into an enclosed area through a heat exchanger in a structure enclosing the enclosed area (Step 2018). The air may be blown into the enclosed area, sucked into the enclosed area, pressurized into the enclosed area, or passively flow into the enclosed area. The air may propagate into the enclosed area in a continuous manner or in short periodic bursts. For example, the heat exchanger may continuously allow the flow of air into the enclosed area. Alternatively, the heat exchanger may prevent air from entering the enclosed area, and allow passage of air when air pressure is built up outside the enclosed area. In one or more embodiments of the invention, air is cooled as it propagates through the heat exchanger. The air may be cooled in any manner including, but not limited to, using gas, liquid, and solid refrigerants within the heat exchanger. In one or more embodiments of the invention, air is propagated into the enclosed area through the heat exchanger from another enclosed area.

Next, air from the enclosed area is propagated through an electronic component of the electronic equipment in accordance with one or more embodiments of the invention (Step 2012). The air may be propagated through the electronic component in any manner including, but not limited to, blowing air into the electronic equipment and sucking air into the electronic equipment from the enclosed area. The air may be propagated through the electronic component in short periodic bursts or with a continuous flow of air. Propagating the air through the electronic component results in cooling of the electronic component and heating of the air propagated through the electronic component. In one or more embodiments of the invention, the air leaving the electronic component is hot or warmer than air entering the electronic equipment before propagating through the electronic component.

In one or more embodiments of the invention, the heat exchanger may be reversed to cool and propagate the cool air out of the enclosed area. In addition, electronic equipment may be reconfigured to propagate air through the electronic component into the enclosed area.

Figure 22:
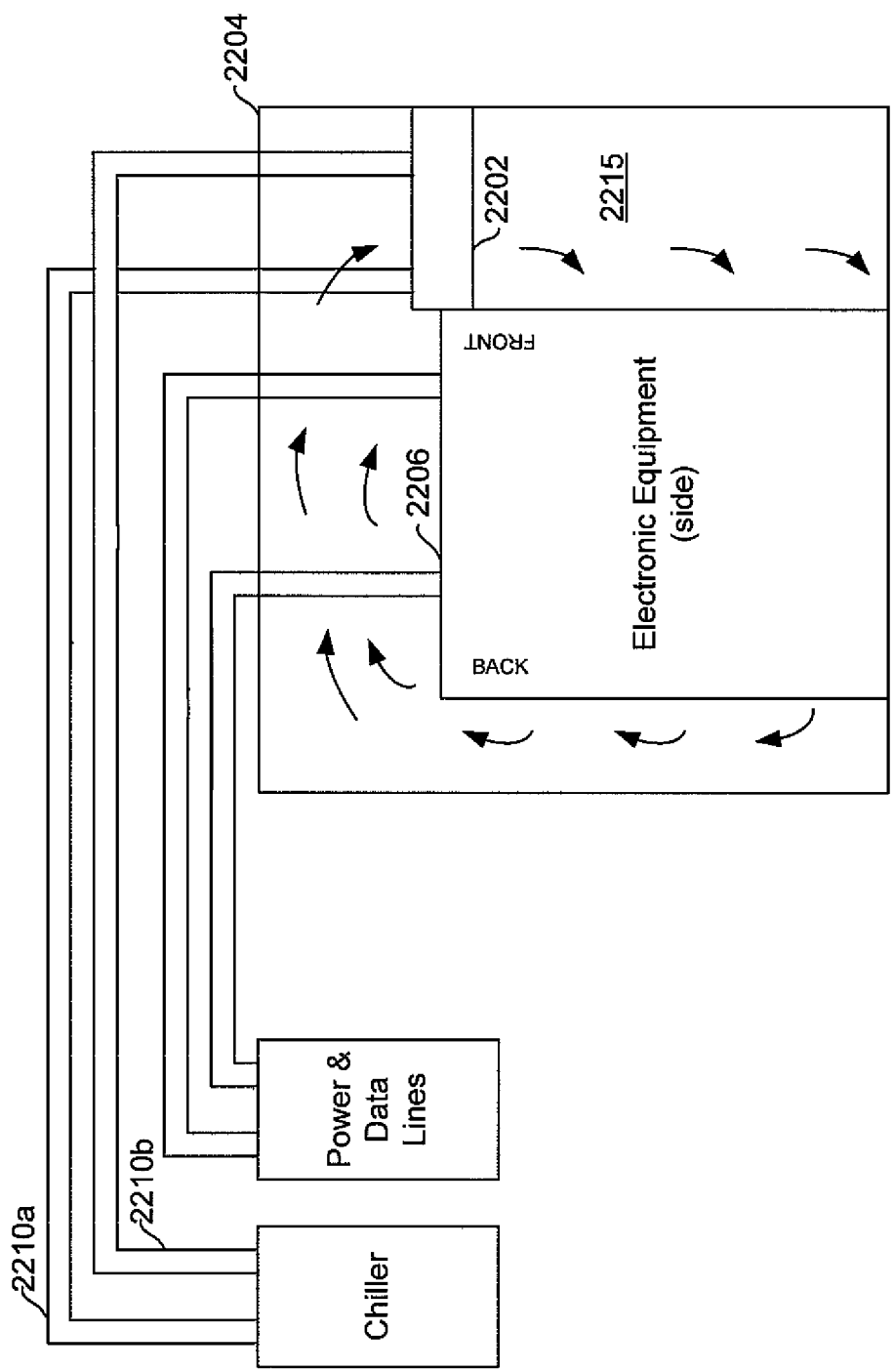
FIG. 22 shows a cooling system in accordance with one or more embodiments of the invention.

FIG. 22 shows an exemplary system in accordance with one or more embodiments of the invention. The refrigerant supply line 2210a and the refrigerant return line 2210b are connected to the air-liquid heat exchanger 2202. One skilled in the art will appreciate that each refrigerant supply line 2210a and output refrigerant line 2210b may be connected to the upper or lower portion of air-liquid heat exchanger 2202. A particular arrangement of refrigerant supply line 2210a and refrigerant return line 2210b, air-liquid heat exchanger 2210 may increase the heat transfer efficiency of the system. Also, one of skilled in the art will appreciate any other arrangements of refrigerant supply lines 2210a and output refrigerant lines 2210b to air-liquid heat exchange units 2202. Also, one skilled in the art will appreciate the various arrangements as stated above with regard to the arrangement of power and data lines to the electronic equipment 2206.

Figure 23:
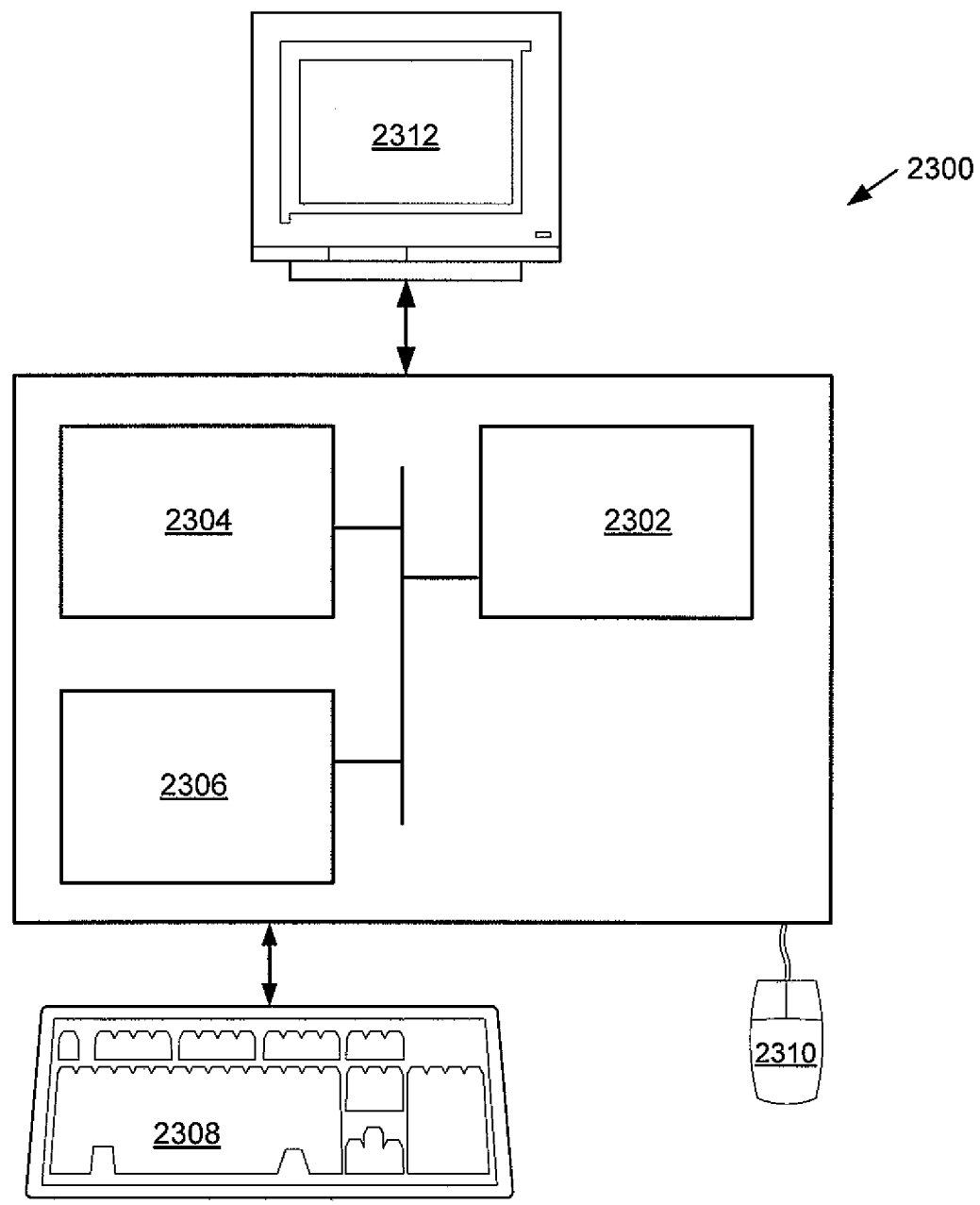
FIG. 23 shows a system in accordance with one or more embodiments of the invention.

Embodiments of the invention (including, but not limited to, for example, flow and temperature detection and correction) may be implemented on virtually any type of computer system, regardless of the platform being used. For example, as shown in FIG. 23, a networked computer system 2300 includes a processor 2302, associated memory 2304, a storage device 2306, and numerous other elements and functionalities typical of a computer (not shown). The networked computer 2300 may also include input means, such as a keyboard 2308 and a mouse 2310, and output means, such as a monitor 2312. The networked computer system 2300 is connected to a local area network (LAN) or a wide area network (e.g., the Internet) (not shown) via a network interface connection (not shown). These input and output means may take other forms. Further, software instructions to perform embodiments of the invention may be stored on a computer readable medium such as a compact disc (CD), a diskette, a tape, a file, or any other computer readable storage device.

Figure 24:
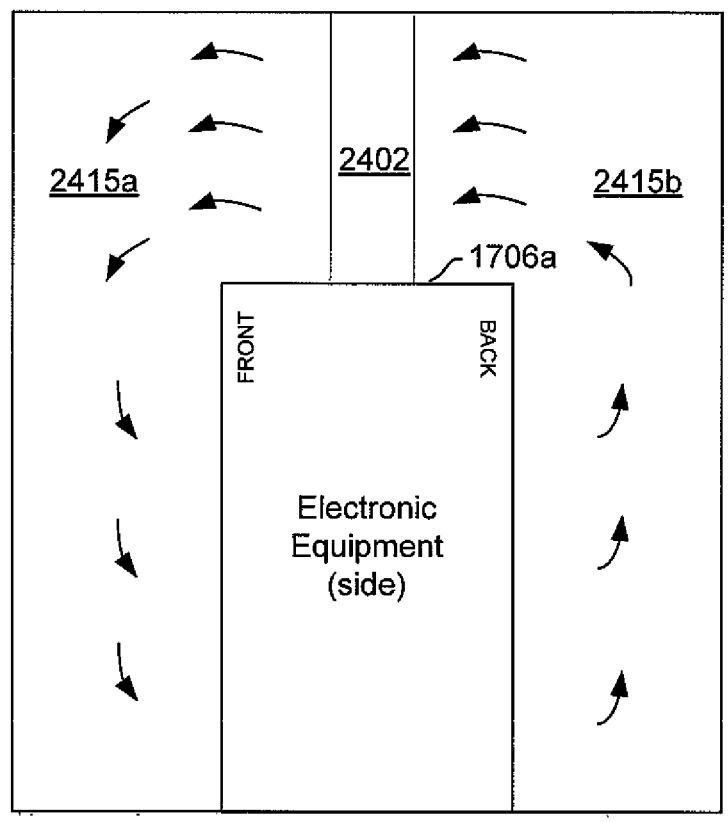
FIGS. 24-30 show a cooling system in accordance with one or more embodiments of the invention.

FIG. 24 shows an exemplary system in accordance with one or more embodiments of the invention. Specifically, FIG. 24 shows a cross-sectional front view of a portion of an enclosure 2404. The enclosure 2404 corresponds to any containment structure (e.g., a room or a cabinet) that contains electronic equipment. As shown in FIG. 24, the enclosure 2404 includes at least one barrier 2402, at least two enclosed areas (i.e., enclosed area 2415a and 2415b), and electronic equipment 2406. An electronic component of the electronic equipment 2406 is cooled by air propagating from the enclosed area 2415a through the electronic equipment 2406 and into the enclosed area 2415b. Subsequently, the air from the enclosed area 2415b is propagated through a heat exchanger disposed in the barrier 2402, into the enclosed area 2415a.

Figure 25:
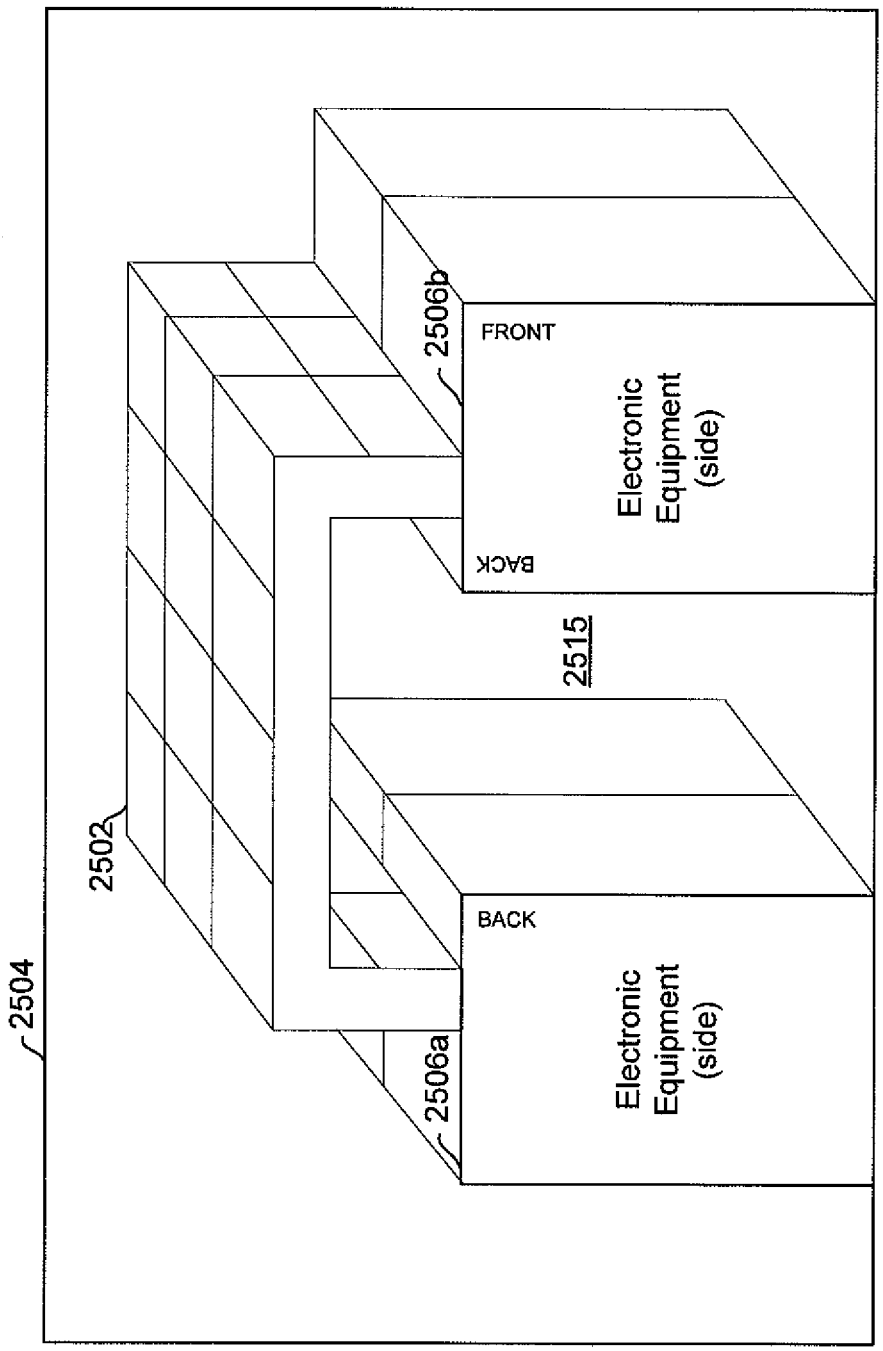

FIG. 25 shows an exemplary system in accordance with one or more embodiments of the invention. Specifically, FIG. 25, which is similar to FIG. 16, shows a perspective view of a portion of an enclosure 2504. The exemplary embodiment includes two racks of servers 2506a and 2506b with an enclosed area 2515 configured to receive air propagated through the racks of servers 2506a and 2506b. Further, FIG. 25 includes a modular barrier 2502 including a plurality of spaces in a grid that may include functionality of modular barriers described above in FIG. 3. In one or more embodiments of the invention, the grid may be a set of uniform squares, e.g., a 2 foot by 2 foot, able to receive any of a number of components as previously described. Alternatively, the grid may be of a different size uniform square, e.g., a 1 foot by 1 foot, may be a non-uniform set of squares, or may be a non-uniform set of non-uniform shapes, e.g., rectangles, trapezoids, circles, etc.

Figure 26A:
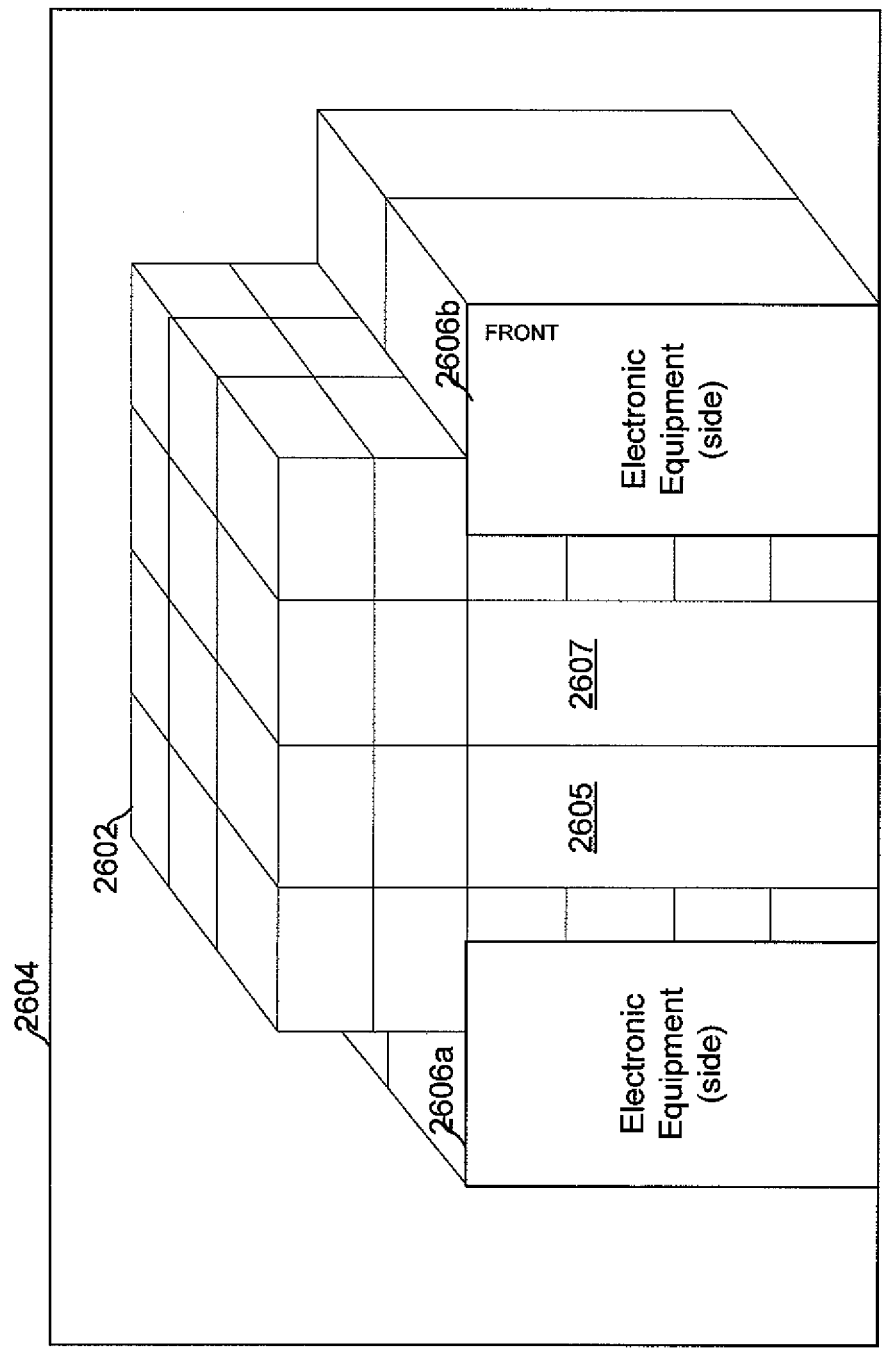
Figure 26B:
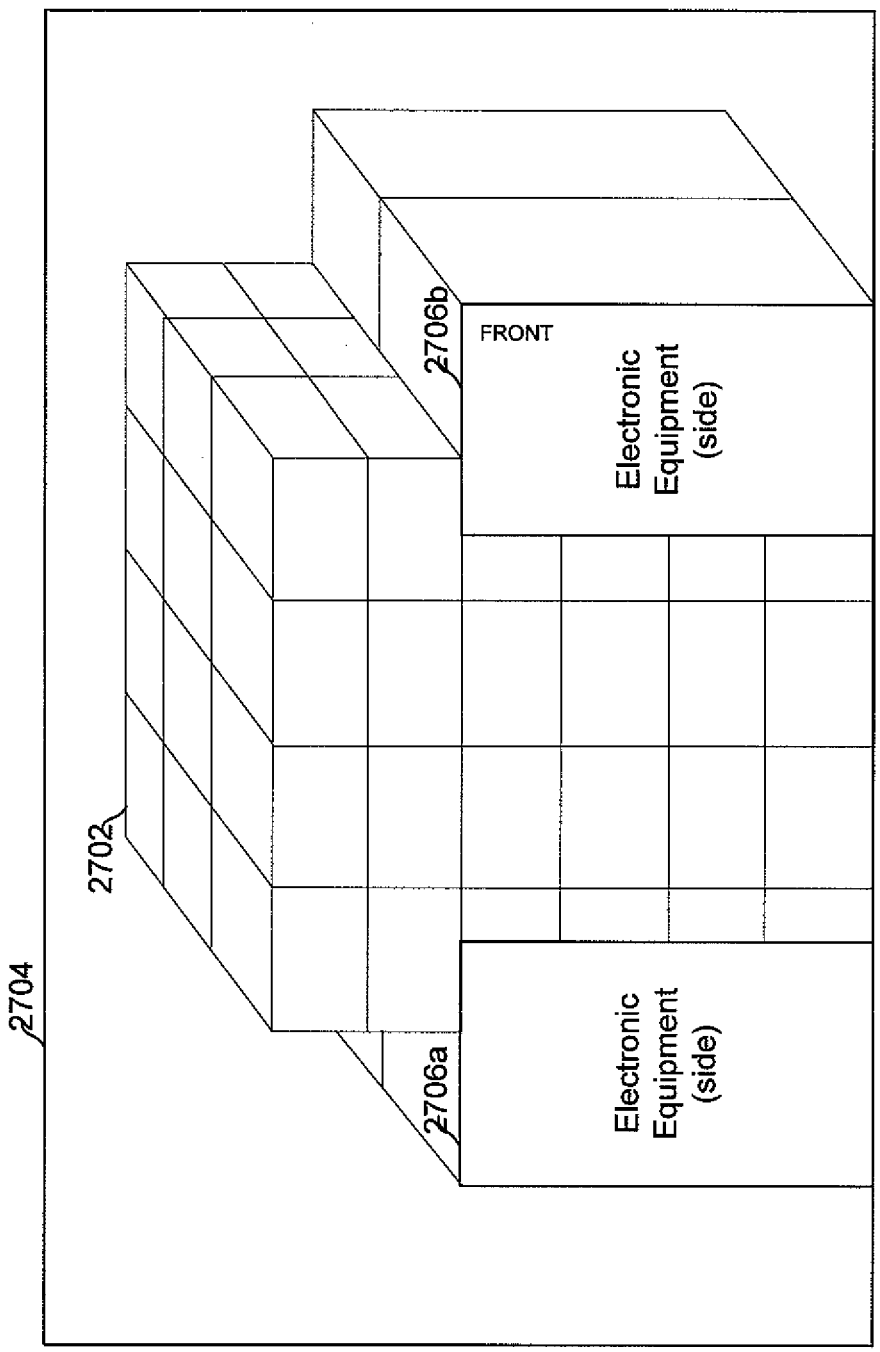

FIGS. 26A and 26B show exemplary systems in accordance with one or more embodiments of the invention. Specifically, FIGS. 26A and 26B, which are similar to FIG. 16, show perspective views of a portion of an enclosure 2604. The exemplary embodiments include two racks of servers 2606a and 2606b with an enclosed area 2615 configured to receive air propagated through the racks of servers 2606a and 2606b. Further, FIGS. 26A and 26B include a modular barrier 2602 including a plurality of spaces in a grid along the roof and walls of the enclosure 2604 that may include functionality of modular barriers described above in FIG. 3. As can be seen in FIG. 26A, the modular barrier may include access doors 2605 and 2607 to facilitate easy access in the enclosed area. In FIG. 26B, in situations where access to the enclosed area is not common, the modular barrier may include spaces in a grid along the entire wall face.

Figure 27:
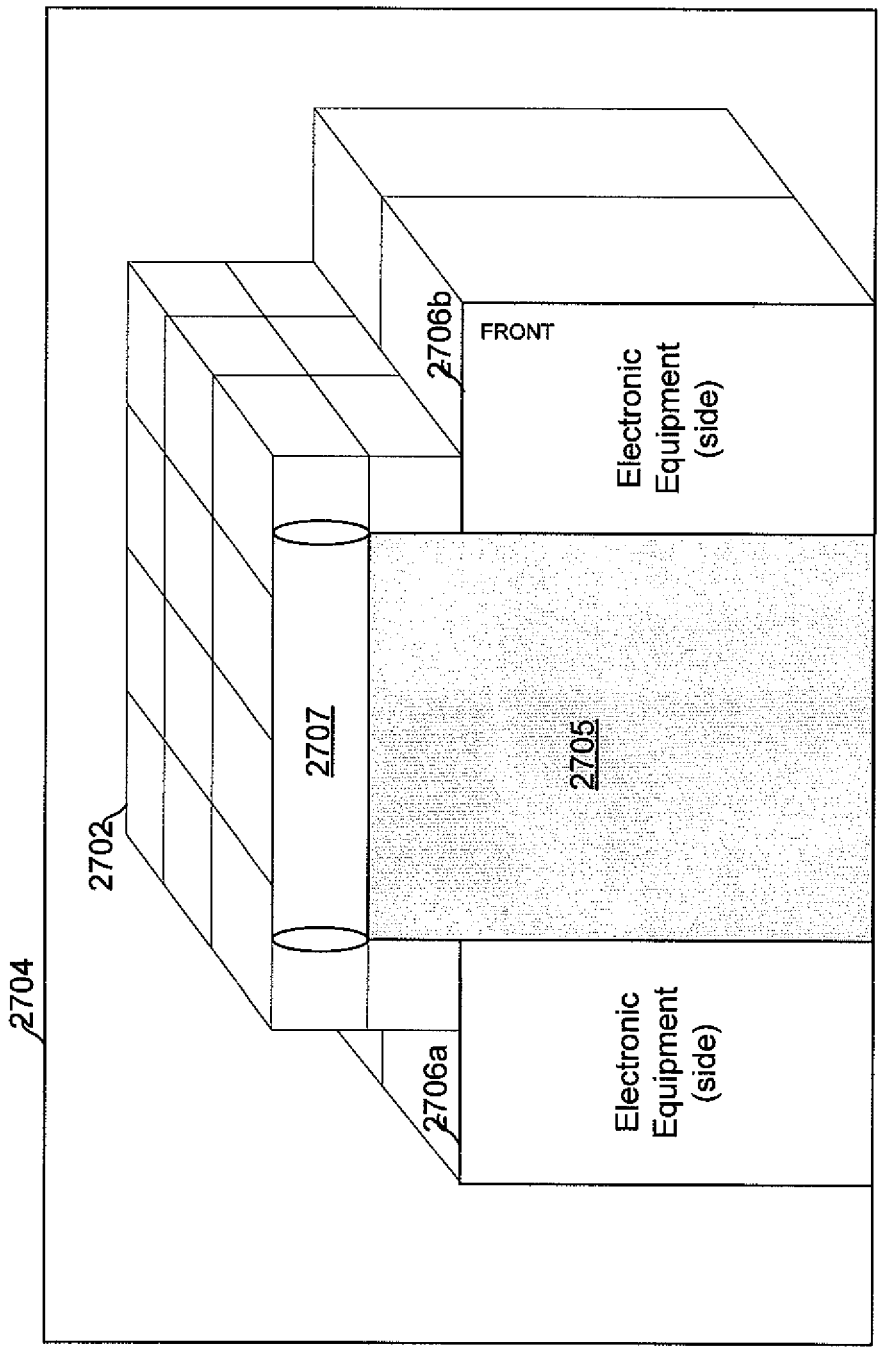

FIG. 27 shows an exemplary system in accordance with one or more embodiments of the invention. Specifically, FIG. 27, which is similar to FIG. 16, shows a perspective view of a portion of an enclosure 2704. The exemplary embodiment includes two racks of servers 2706a and 2706b with an enclosed area 2715 configured to receive air propagated through the racks of servers 2706a and 2706b. Further, FIG. 27 includes a modular barrier 2702 including a plurality of spaces in a grid along the roof and walls of the enclosure 2704 that may include functionality of modular barriers described above in FIG. 3. Further, in the embodiment shown barrier 2702 includes a retractable doorway 2705 that can be rolled up into compartment 2707.

Figure 28:
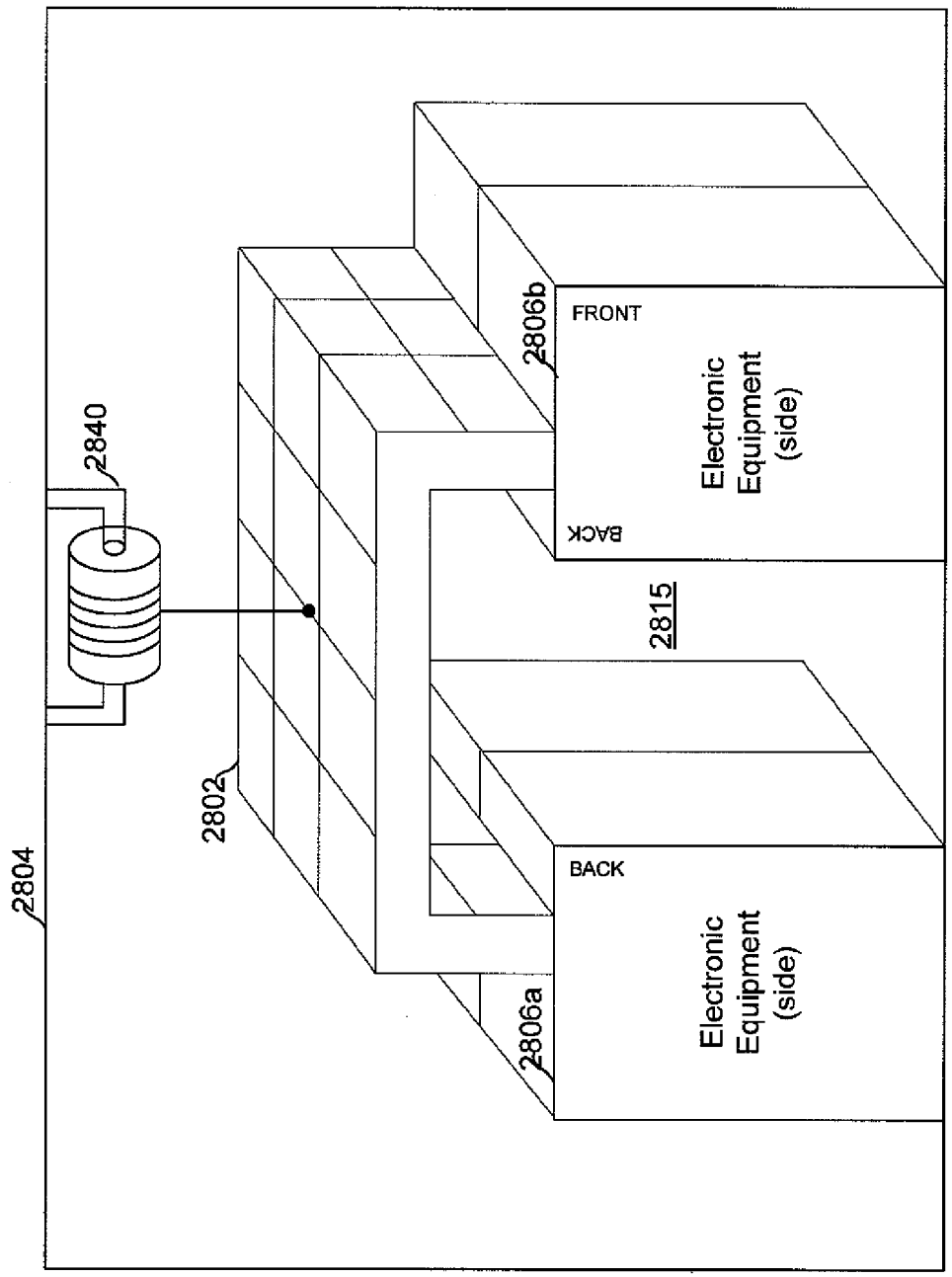
Figure 29:
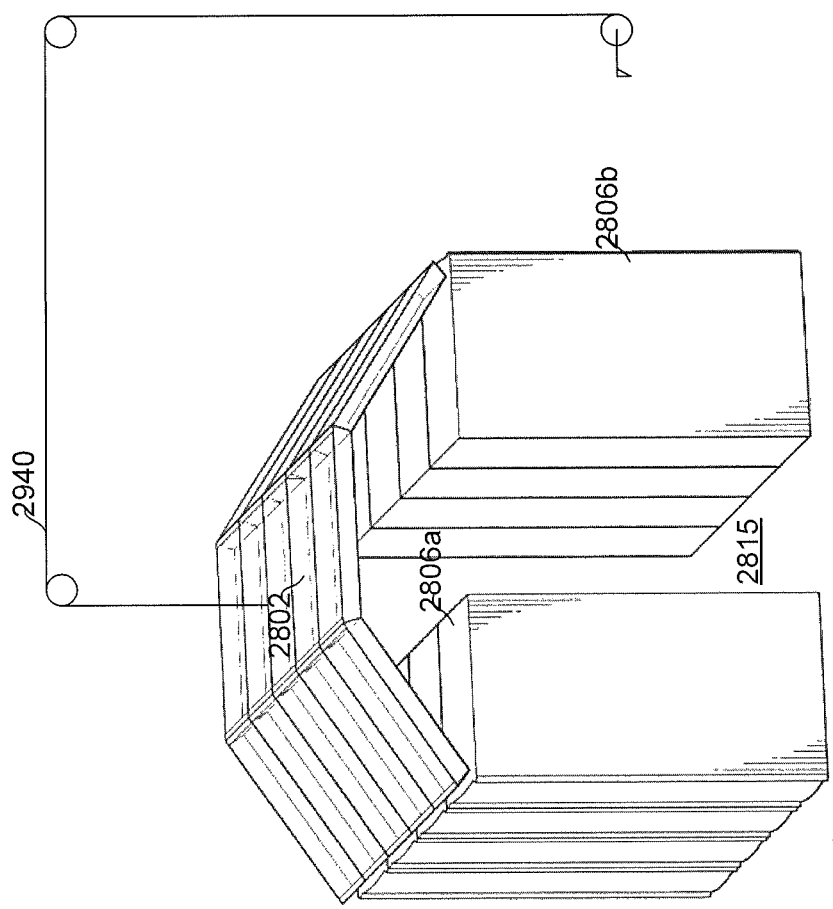

FIGS. 28 and 29 show exemplary systems in accordance with one or more embodiments of the invention. Specifically, FIGS. 28 and 29, which are similar to FIG. 16, show a perspective view of a portion of an enclosure 2804. Exemplary embodiment includes two racks of servers 2806a and 2806b with an enclosed area 2815 configured to receive air propagated through the racks of servers 2806a and 2806b. Further, FIG. 28 includes a detachable and/or removable modular barrier 2802 including a plurality of spaces in a grid along the roof and/or walls of the enclosure 2804 that may include functionality of modular barriers described above in FIG. 3. The modular barrier 2802 may be raised using a device 2804 (e.g., a pulley, a hydraulic lift, or any other device suitable for detaching and/or lifting the barrier 2802). Similarly, in FIG. 29, the modular barrier 2802 may be raised using a device 2940.

Figure 30:
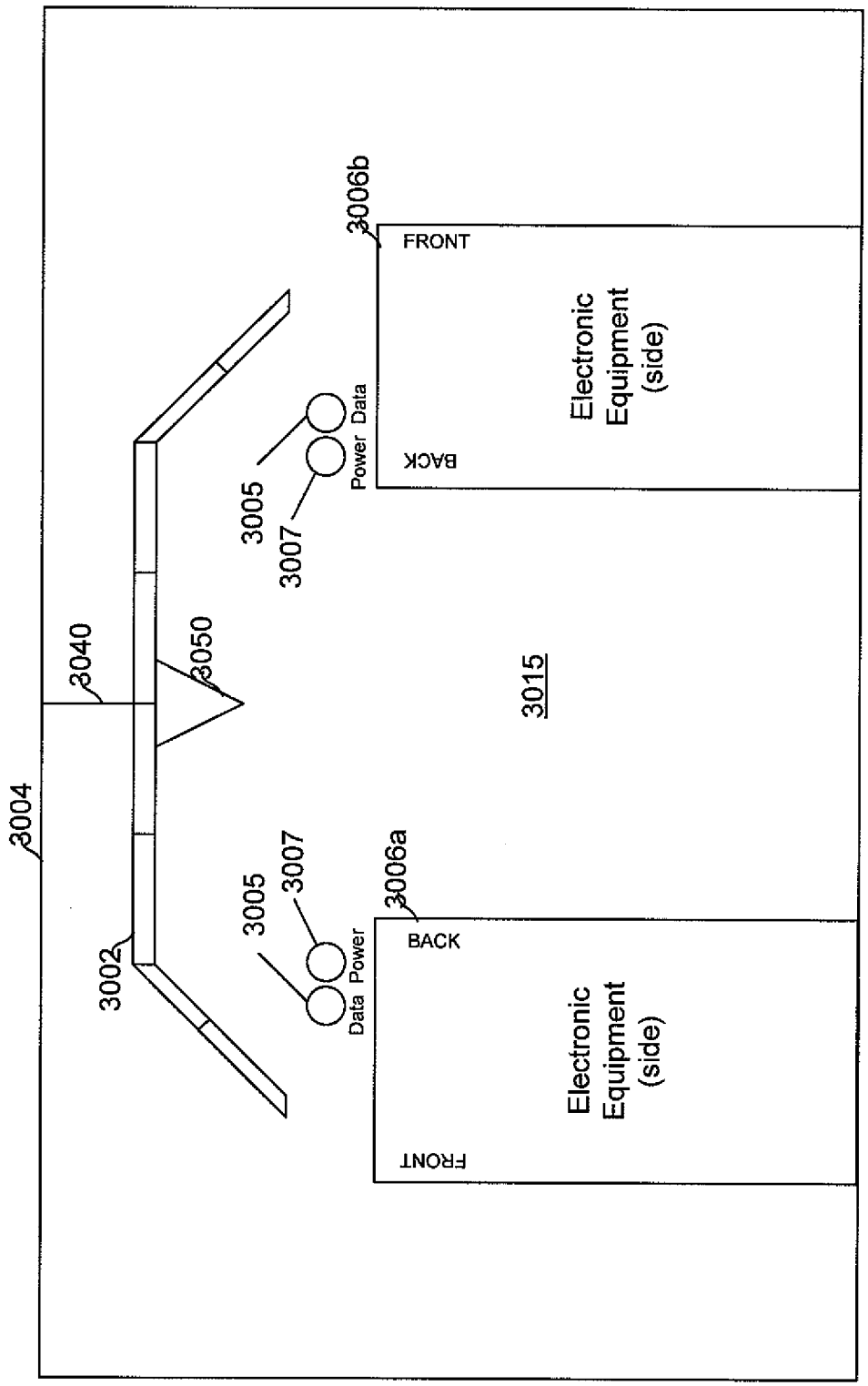
Figure 31A:
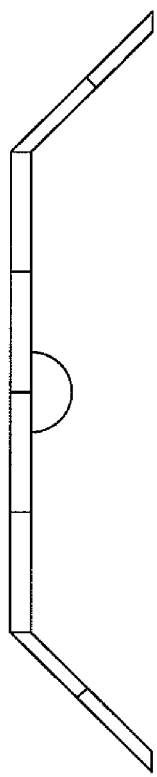
FIGS. 31A-31D show a barrier in accordance with one or more embodiments of the invention.
Figure 31B:
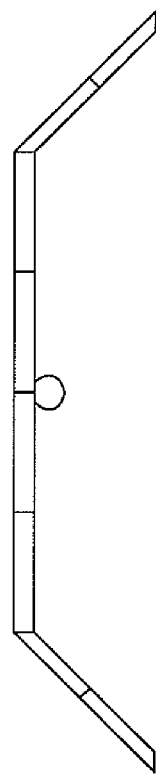
Figure 31C:
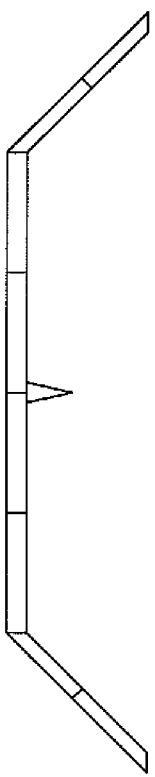
Figure 31D:
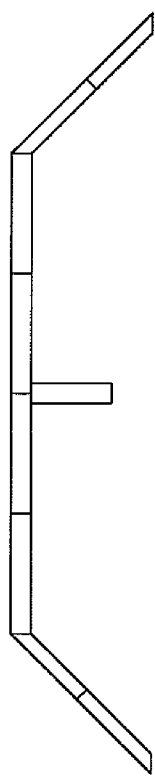

FIG. 30 is similar to FIG. 29 and shows the modular barrier 3002 lifted away from the top portions of the electronic equipment in the enclosed area. FIG. 30 further includes an aerodynamic device 3050 (e.g., a fin for directing air flow). The aerodynamic device 3050 may be attached anywhere within the enclosed area and may include functionality to improve the air flow in a beneficial manner. Exemplary shapes of the aerodynamic device 350 are shown in FIGS. 31A-31D. As can also be seen in FIG. 30, once in the raised position, modular barrier 3002 is out of the way and, for instance, data and power lines 3005 and 3007 can be easily serviced.

Figure 32:
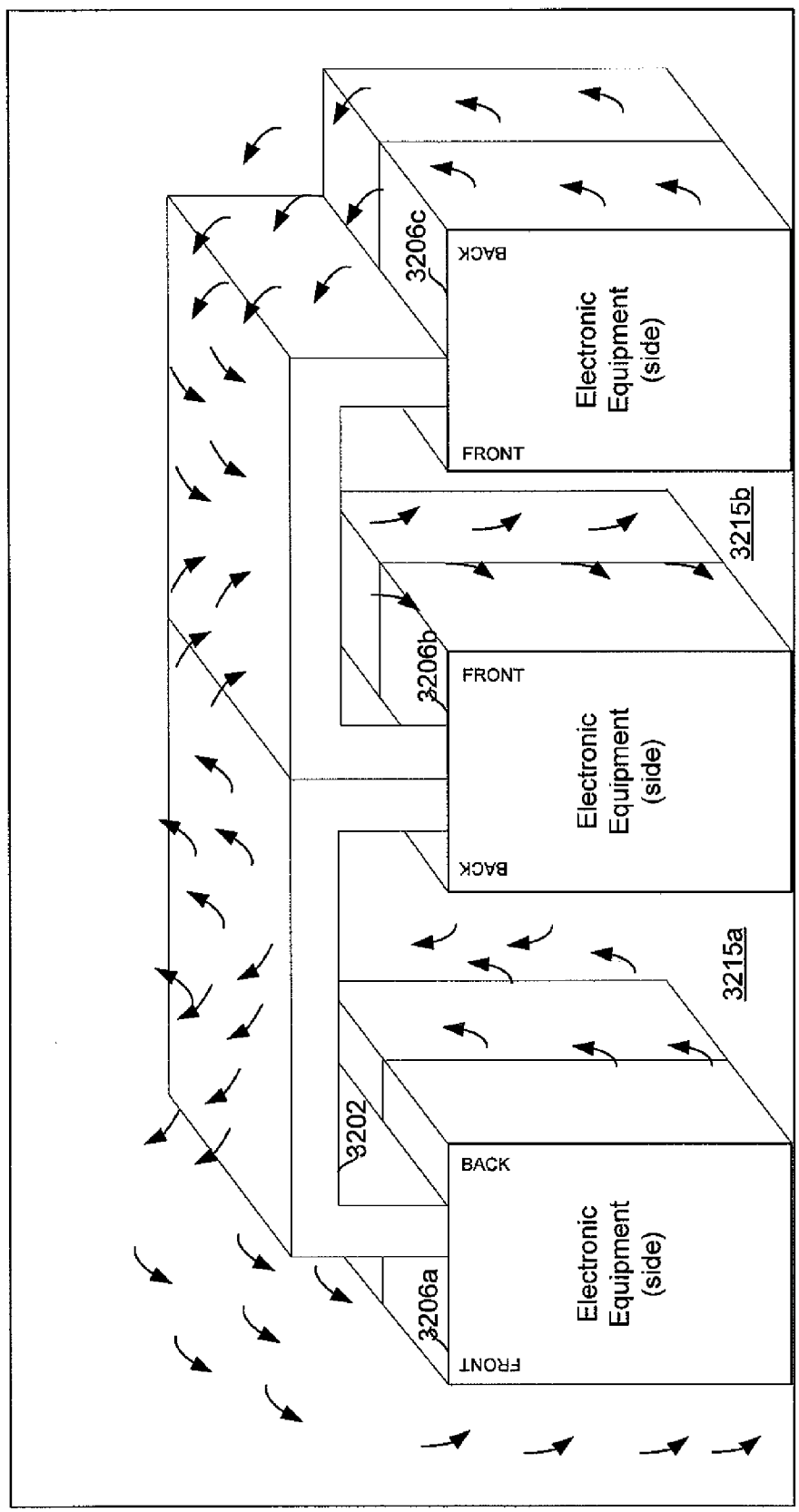
FIGS. 32-35 show a cooling system in accordance with one or more embodiments of the invention.

FIG. 32 shows an exemplary system with a hot aisle 3215a and a cold aisle 3215b in accordance with one or more embodiments of the invention. Hot aisle 3215a corresponds to an enclosed area with hot air and cold aisle 3215b corresponds to an enclosed area with cold air. Specifically, FIG. 32, shows a perspective view of a portion of an enclosure 3204. The exemplary embodiment includes three racks of servers 3206a, 3206b, and 3206c with a first enclosed area (i.e. hot aisle 3215a) configured to receive air propagated through the racks of servers 3206a and 3206b and a second enclosed area (i.e. cold aisle 3215b) configured to provide air for propagation through the racks of servers 3215b and 3215c. Further, FIG. 32 includes a modular barrier 3202 including a plurality of spaces in a grid along the roof and walls of the enclosure 3204 that may include functionality of modular barriers described above in FIG. 3.

Figure 33:
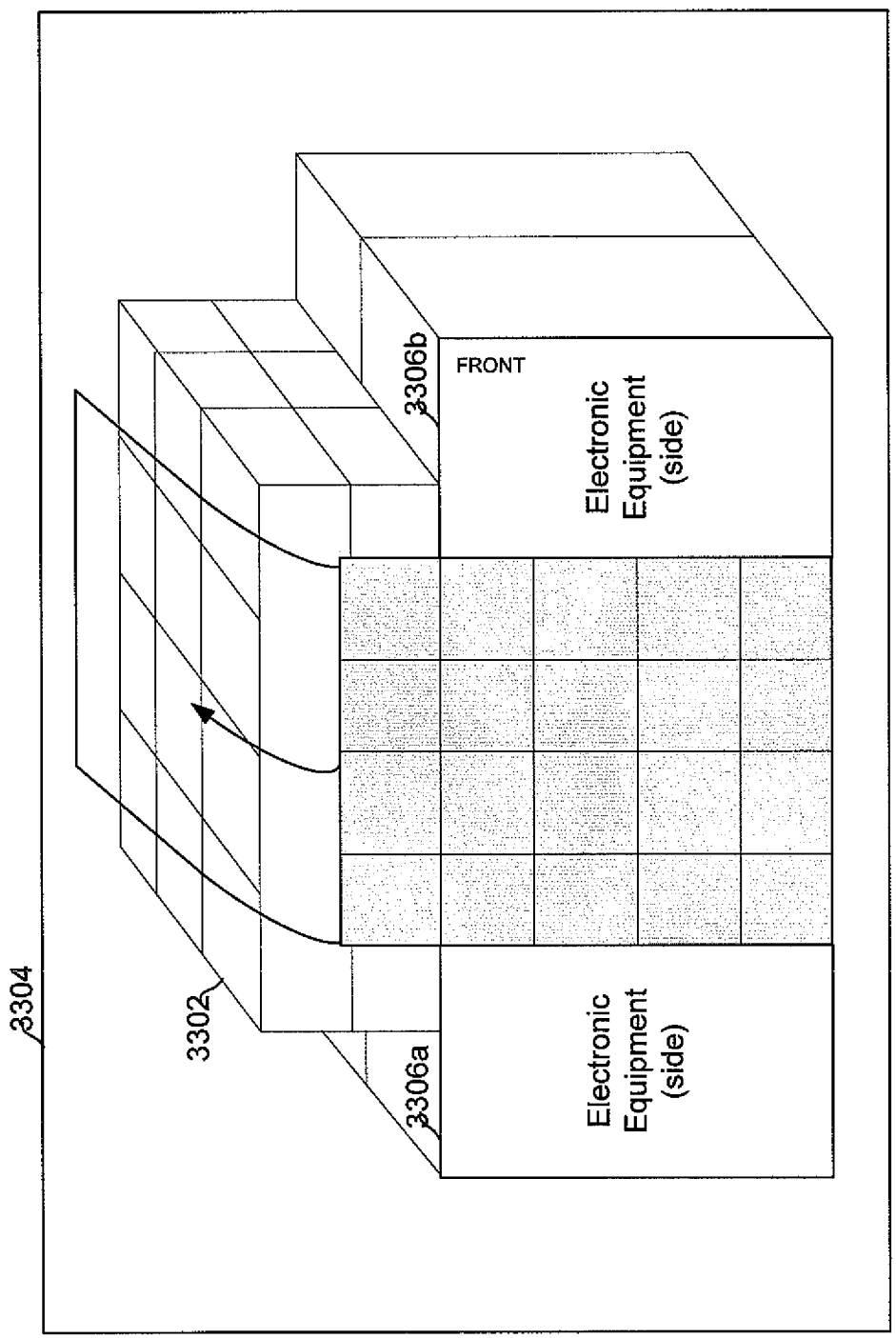
Figure 34:
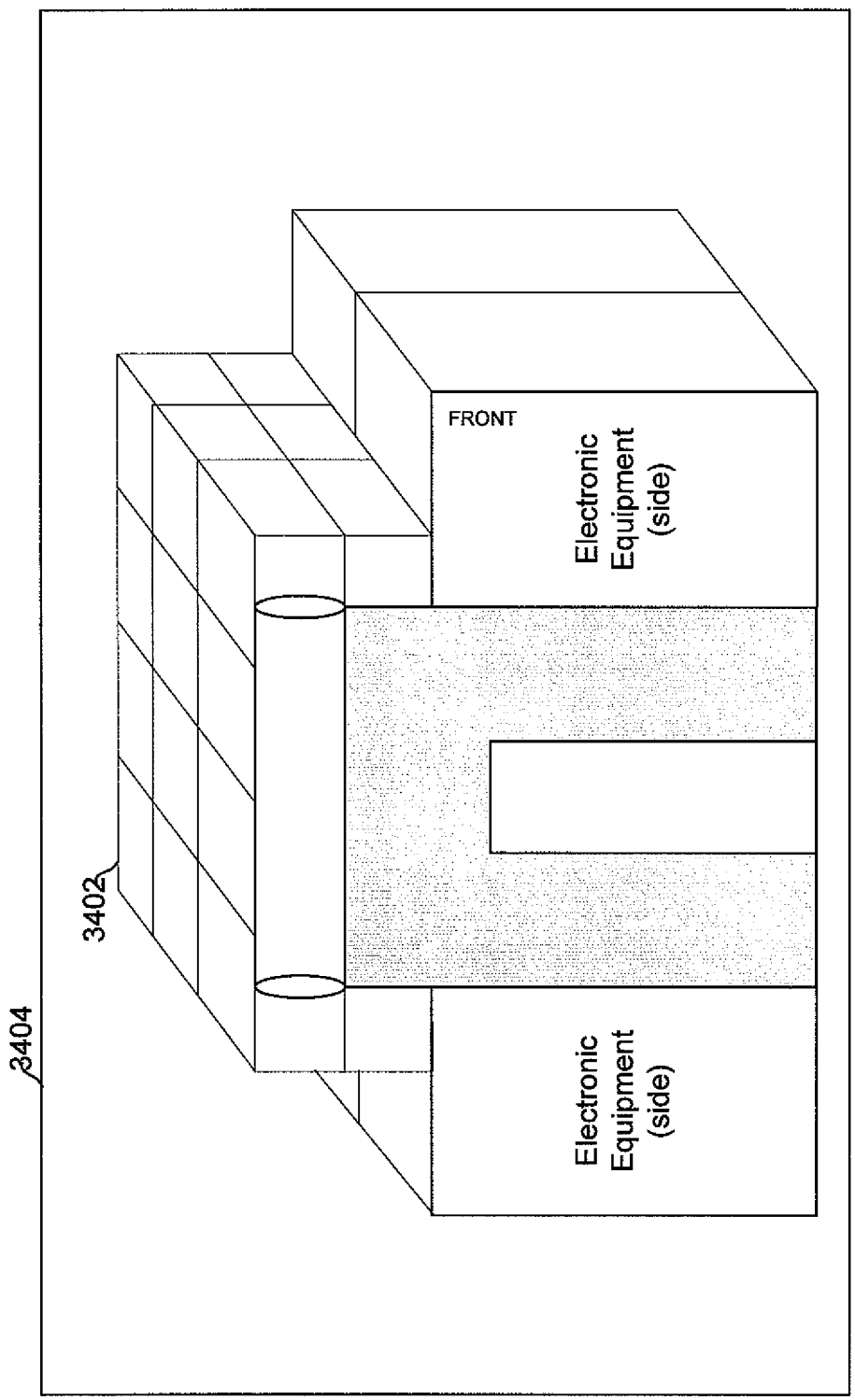

FIGS. 33 and 34 are similar to FIG. 26B and shows a side wall being movable on a track and a retractable wall with a door, respectively.

Figure 35:
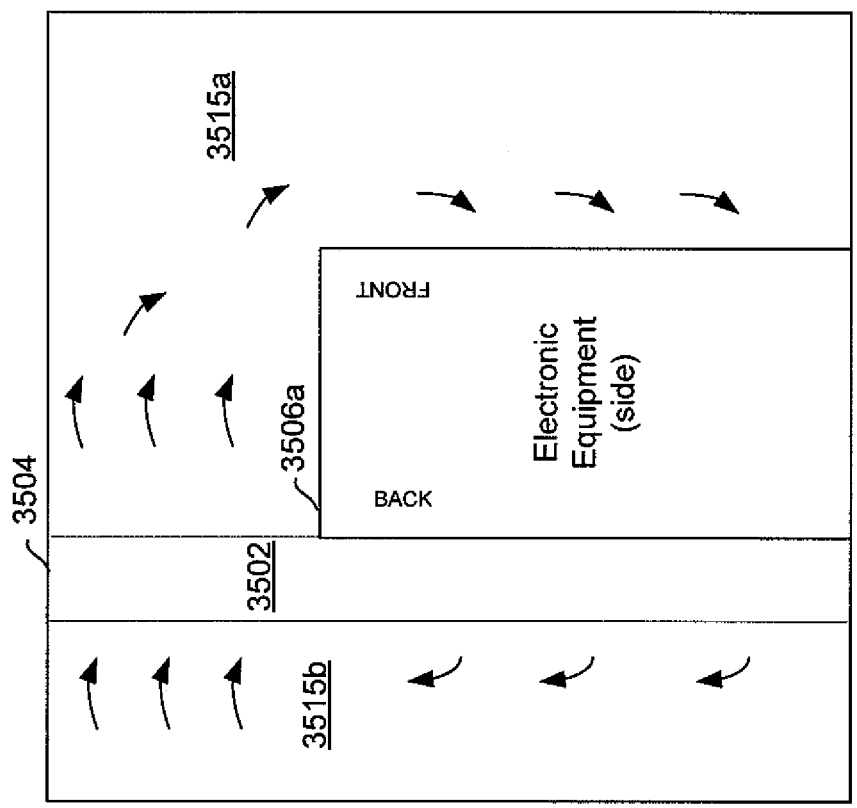

FIG. 35 is similar to FIG. 24 and shows a barrier 3502 extending from the ceiling to the floor to create two enclosed areas 3515a and 3515b. Specifically, FIG. 35 shows a cross-sectional front view of a portion of an enclosure 3504. The enclosure 3504 corresponds to any containment structure (e.g., a room or a cabinet) that contains electronic equipment. As shown in FIG. 35, the enclosure 3504 includes at least one barrier 3502, at least two enclosed areas (i.e., enclosed area 3515a and 3515b), and electronic equipment 3406. An electronic component of the electronic equipment 3406 is cooled by air propagating from the enclosed area 3515a through the electronic equipment 3406 and into the enclosed area 3415b. Subsequently, the air from the enclosed area 3415b is propagated trough a heat exchanger disposed in the barrier 3402, into the enclosed area 3415a.

In one or more embodiments of the invention, air flow trough some components of the enclosure is propagated due to pressure in an enclosed area. Accordingly, the use of air blowing devices may be reduced in some components of the enclosure and power may be saved.

In one or more embodiments of the invention, an enclosed area is used to store hot air which substantially flows trough a heat exchanger and accordingly cools before exiting the enclosed portion of the enclosure. Further, the heat exchanger may be placed strategically where a substantial portion of the hot air rises directly through the heat exchanger without the need of a fan to ensure the hot air reaches the heat exchanger.

In one or more embodiments of the invention, an enclosed area is used to store cold air which is used to propagate through electronic equipment for cooling the electronic equipment. Storing the cold air in an enclosed area requires cooling only the air in the enclosed area and not the entire enclosure.

In one or more embodiments of the invention, multiple enclosed areas allow propagation of air using pressure, provide a smaller area of cooling leading to utility savings, and/or allow for implementation of a pressure control system to circulate the air.

In one or more embodiments of the invention, an enclosed area allows for far greater fan efficiency as the fans may be configured to blow air in a specific route directly toward or away from a heat exchanger.

In one or more embodiments of the invention, an enclosed area allows for controlled airflow leading to efficiency by reducing the random movement of air particles.

In one or more embodiments of the invention, the enclosed area may be fitted with fins and or other objects to improve the aerodynamics of air flowing within the enclosure.

In one or more embodiments of the invention, an enclosed area protects electronic equipment, cables, heat exchangers and any other components within the enclosed area.

In one or more embodiments of the invention, using a modular barrier for enclosing areas within the server allow for flexibility including adding and removing heat exchangers, lights, data line, power lines, cable lines, emergency lines, water lines and any other useful components needed within the enclosed area.

In one or more embodiments of the invention, a modular enclosed area allows for easy upgrades of servers within the enclosure with different power and cooling requirements and changing the size, shape and amount of servers.

In one or more embodiments of the invention, a modular enclosed area allows access from all sides of an enclosed area as needed.

In one or more embodiments of the invention, a barrier used to enclose the enclosed area is retractable, or detachable. A retractable or detachable barrier allows for easy access to cables, wires, equipment, heat exchangers and any other components within the enclosure.

In one or more embodiments of the invention, a barrier used to enclose the enclosed area may be retracted upward allowing a person standing on the ground to easily reach necessary components and subsequently lower the barrier to reseal the enclosed area.

In one or more embodiments of the invention, a quick opening and closing barrier or a modular barrier allows for quick access without losing a substantial amount of hot or cold air from an enclosed area resulting in power savings.

In one or more embodiments of the invention, the heat exchanger maybe reversible, allowing for easy reconfiguration of the components within an enclosure.

In one or more embodiments of the invention, the heat exchanger maybe reversible allowing an administrator to test various configurations of the components with ease within an enclosure to determine the most efficient or useful configuration.

In one or more embodiments of the invention, multiple heat exchangers may be stacked on top of one another to increase the amount of cooling performed.

In one or more embodiments of the invention, the use of heat exchangers as an exit of an enclosed hot air area or an entrance to an enclosed cold air area saves the amount of power used to dissipate the heat generated by the electronic components.

In one or more embodiments of the invention, only passive elements are used to perform the dissipation of heat, which reduces the noise generated and reduces power consumption.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for cooling a first electronic component and a second electronic component in a room, comprising:
    disposing the first electronic component and the second electronic component in parallel in the room to create an aisle therebetween;
    disposing a retractable cap over the first electronic component and the second electronic component without a mechanical connection therebetween, so that the aisle is an enclosed area enclosed by the first and second electronic components and the retractable cap when the retractable cap is in a lowered state,
        wherein the retractable cap does not enclose the aisle when the retractable cap is in a raised state, and
        wherein the cap extends over but not beyond the first and the second electronic components; and
    propagating air through the enclosed area and the first and second electronic component to cool the first electronic component and the second electronic component;
    circulating a refrigerant in a cooling loop, wherein the cooling loop comprises a heat exchanger; and
    propagating the air, wherein the air is cooled by passing through the heat exchanger,
    wherein the heat exchanger is a reversible heat exchanger disposed in the retractable cap to reverse direction of air propagating through the enclosed area,
    wherein the retractable cap is supported at a center thereof by a lift mechanism, and
    wherein the center is a center between the first electronic component and the second electronic component.

2. The method of claim 1, wherein the air is propagated from the enclosed area through the first and second electronic components.

3. The method of claim 1, wherein the air is propagated to the enclosed area through the first and second electronic components.

4. The method of claim 1,
    wherein the retractable cap comprises a grid,
    wherein the heat exchanger is in a first space of a plurality of spaces comprised in the grid, and
    wherein at least a portion of the grid encloses at least a portion of the enclosed area.

5. The method of claim 1, further comprising:
    disposing a third electronic component in parallel with second electronic component, forming another aisle therebetween;
    retracting the retractable cap from the first and second electronic components; and
    disposing the retractable cap over the second electronic component and the third electronic component so that the another aisle is an enclosed area enclosed by the second and third electronic components and the retractable cap.

6. The method of claim 3, wherein the air is propagated out of the enclosed area and rises through the heat exchanger.

7. The method of claim 6, wherein the air rises passively through the heat exchanger without the use of an air blowing device.

8. A room comprising:
    a first electronic component and a second electronic component disposed in parallel in the room to create an aisle therebetween;

a retractable cap disposed over the first electronic component and the second electronic component without a mechanical connection therebetween so that the aisle is an enclosed area enclosed by the first and second electronic components and the retractable cap when the retractable cap is in a lowered state,
    wherein the retractable cap does not enclose the aisle when the retractable cap is in a raised state,
    wherein the cap extends over but not beyond the first and the second electronic component; and
a cooling loop;
wherein the first electronic component and the second electronic component are cooled by air propagating through the enclosed area, the first electronic component, and the second electronic component,
wherein the cooling loop circulates a refrigerant,
wherein the cooling loop comprises a heat exchanger,
wherein the air is propagated through the heat exchanger,
wherein the air is cooled by passing through the heat exchanger,
wherein the heat exchanger is a reversible heat exchanger disposed in the retractable cap to reverse direction of air propagating through the enclosed area,
wherein the retractable cap is supported at a center thereof by a lift mechanism, and
wherein the center is a center between the first electronic component and the second electronic component.

9. The room of claim 8, wherein the air is propagated from the enclosed area through the first and second electronic components.

10. The enclosure of claim 8, wherein the air is propagated to the enclosed area through the first and second electronic components.

11. The room of claim 8,
wherein the retractable cap comprises a grid having a plurality of spaces,
wherein the heat exchanger is in a first space of the plurality of spaces, and
wherein at least a portion of the grid encloses at least a portion of the enclosed area.

12. The room of claim 8, further comprising:
a third electronic component disposed in parallel with the second electronic component, forming another aisle therebetween; and
another retractable cap disposed over the second electronic component and the third electronic component so that the another aisle is an enclosed area enclosed by the second and third electronic components and the another retractable cap.

13. The room of claim 8, wherein the air is propagated out of the enclosed area and rises through the heat exchanger.

14. The room of claim 13, wherein the air rises passively through the heat exchanger without the use of an air blowing device.

15. The room of claim 8, further comprising:
a third electronic component disposed in parallel with the second electronic component, forming another aisle therebetween,
wherein the retractable cap is configured to be retracted from the first and second electronic components and disposed onto the second electronic component and the third electronic component so that the another aisle is an enclosed area enclosed by the second and third electronic components and the retractable cap.

16. The method of claim 1, further comprising:
disposing a third electronic component in parallel with the second electronic component, forming another aisle therebetween; and
disposing another retractable cap over the second electronic component and the third electronic component so that the another aisle is an enclosed area enclosed by the second and third electronic components and the another retractable cap.

17. The method of claim 16,
wherein the air is propagated from the enclosed area through the first and second electronic components
wherein the air is propagated from the another enclosed area through the second and third electronic components.

18. The room of claim 12,
wherein the air is propagated from the enclosed area through the first and second electronic components
wherein the air is propagated from the another enclosed area through the second and third electronic components.

19. The method of claim 1, wherein the retractable cap contacts the first and second electronic components when lowered and does not contact the first and second electronic components when raised.

20. The room of claim 8, wherein the retractable cap contacts the first and second electronic components when lowered and does not contact the first and second electronic components when raised.

* * * * *